United States Patent
Iwata

(10) Patent No.: US 7,681,801 B2
(45) Date of Patent: Mar. 23, 2010

(54) RFID CHIP WITH WRITE-ONCE FUNCTIONALITY FOR AN OPERATION-STOP INSTRUCTION

(75) Inventor: Shusuke Iwata, Hyogo (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 0 days.

(21) Appl. No.: 11/442,611

(22) Filed: May 30, 2006

(65) Prior Publication Data
US 2006/0273182 A1 Dec. 7, 2006

(30) Foreign Application Priority Data
May 31, 2005 (JP) ............... 2005-159479

(51) Int. Cl.
*G06K 19/00* (2006.01)
(52) U.S. Cl. ...................... 235/487; 235/492
(58) Field of Classification Search ................. 235/492, 235/487
See application file for complete search history.

(56) References Cited

U.S. PATENT DOCUMENTS

| | | | | |
|---|---|---|---|---|
| 4,092,524 A * | 5/1978 | Moreno | ............... | 235/419 |
| 4,152,627 A * | 5/1979 | Priel et al. | ............. | 365/227 |
| 6,005,270 A * | 12/1999 | Noguchi | ............... | 257/315 |
| 6,317,028 B1 * | 11/2001 | Valiulis | ............... | 340/10.1 |
| 6,385,074 B1 * | 5/2002 | Johnson et al. | ............ | 365/103 |
| 6,528,815 B1 * | 3/2003 | Brown et al. | ............ | 257/40 |
| 6,583,490 B2 | 6/2003 | Hagiwara et al. | | |
| 6,584,029 B2 | 6/2003 | Tran et al. | | |
| 6,625,057 B2 | 9/2003 | Iwata | | |
| 6,768,661 B2 * | 7/2004 | Vyvoda et al. | ............ | 365/51 |
| 6,800,527 B2 | 10/2004 | Hagiwara et al. | | |
| 6,933,848 B1 * | 8/2005 | Stewart et al. | .......... | 340/572.3 |
| 7,051,251 B2 * | 5/2006 | Moore et al. | ............ | 714/710 |
| 7,164,611 B2 * | 1/2007 | Kinsley | ............... | 365/195 |
| 2002/0008278 A1 * | 1/2002 | Mori | ............... | 257/315 |
| 2002/0089024 A1 * | 7/2002 | Iwata | ............... | 257/421 |
| 2002/0105050 A1 | 8/2002 | Hagiwara et al. | | |
| 2002/0141221 A1 * | 10/2002 | Chernobrod et al. | ........ | 365/110 |

(Continued)

FOREIGN PATENT DOCUMENTS

EP 1 229 552 8/2002

(Continued)

OTHER PUBLICATIONS

International Search Report dated Aug. 1, 2006 for Application No. PCT/JP2006/310943.

(Continued)

*Primary Examiner*—Daniel A Hess
*Assistant Examiner*—Paultep Savusdiphol
(74) *Attorney, Agent, or Firm*—Eric J. Robinson; Robinson Intellectual Property Law Office, P.C.

(57) ABSTRACT

When an operation-stop instruction is received from an RFID reader/writer, an RFID chip decodes the instruction by a control circuit and conducts the operation-stop instruction. In addition, the RFID chip uses a register which has a write-once function such as an organic memory and does not return to an original state physically if a value is written once as a register which maintains a setting whether there is an operation-stop or not.

29 Claims, 12 Drawing Sheets

U.S. PATENT DOCUMENTS

| | | | |
|---|---|---|---|
| 2002/0149468 A1* | 10/2002 | Carrender et al. | 340/5.61 |
| 2003/0146467 A1 | 8/2003 | Hagiwara et al. | |
| 2004/0001348 A1* | 1/2004 | Vyvoda et al. | 365/51 |
| 2004/0123064 A1* | 6/2004 | Moore et al. | 711/170 |
| 2004/0184296 A1* | 9/2004 | Vyvoda et al. | 365/51 |
| 2005/0078537 A1* | 4/2005 | So et al. | 365/211 |
| 2005/0140501 A1* | 6/2005 | Rizzo et al. | 340/10.51 |
| 2005/0180187 A1 | 8/2005 | Koyama | |
| 2005/0212662 A1* | 9/2005 | Amtmann et al. | 340/10.51 |
| 2006/0220252 A1 | 10/2006 | Yukawa et al. | |
| 2007/0153565 A1 | 7/2007 | Nomura et al. | |
| 2007/0168623 A1 | 7/2007 | Amtmann | |
| 2007/0215869 A1 | 9/2007 | Moriya et al. | |

FOREIGN PATENT DOCUMENTS

| | | |
|---|---|---|
| EP | 1 286 356 | 2/2003 |
| GB | 1 543 602 | 4/1979 |
| JP | 60-001666 | 1/1985 |
| JP | 05-267689 | 10/1993 |
| JP | 11-087545 | 3/1999 |
| JP | 2002-175509 | 6/2002 |
| JP | 2002-216482 | 8/2002 |
| JP | 2002-231899 | 8/2002 |
| JP | 2003-308495 | 10/2003 |
| JP | 2005-115746 | 4/2005 |
| WO | WO 03/094105 | 11/2003 |
| WO | WO 2005/043457 | 5/2005 |
| WO | WO 2005/076281 | 8/2005 |
| WO | WO 2006/059554 | 6/2006 |
| WO | WO 2006/062143 | 6/2006 |
| WO | WO 2006/085637 | 8/2006 |

OTHER PUBLICATIONS

Written Opinion dated Aug. 1, 2006 for Application No. PCT/JP2006/310943.

K. Ando, *Special Report: IC Tag, Assignment for Progress*, Nikkei Byte, May 2003, pp. 78-85.

Search Report (Application No. 06756862.6) dated Oct. 17, 2008.

* cited by examiner

1201

1201

1201

1201

RFID CHIP WITH WRITE-ONCE FUNCTIONALITY FOR AN OPERATION-STOP INSTRUCTION

TECHNICAL FIELD

The present invention relates to a semiconductor device using an RFID (Radio Frequency Identification) technique having a function for stopping operation.

BACKGROUND ART

In recent years, RFID has been widely spread and has become to be gradually used for product management, a ticket for transport facilities, a cash card, and the like.

In a case where RFID is used for product management, it enables to provide such high-quality service that the stock status of a product can be managed more easily, or detail information on a product can be maintained in RFID to be seen by a terminal or the like in a store. Further, RFID is used for the prevention of shoplifting.

In addition, in a case where RFID is used to function as a cash card, it enables to pay at a cashier by carrying only one card, while it is necessary for a user to carry cash and pay cash at a register, which is a conventional and complicated operation. As described above, RFID offers convenience to life; however, disadvantage due to characteristics that communication is conducted wirelessly is also conceivable.

For example, in a case where RFID is used for product management, there is a possibility that what a user purchased is read by an RFID reader/writer after the user finished shopping and left a store. Thus, one's information can be read by others without notice because communication is conducted wirelessly.

Further, in a case where RFID storing important personal information such as a credit card is lost, information stored inside the credit card can be secretly seen by others. Under such a condition, it is desirable that RFID does not conduct a requirement if a writing requirement or a reading requirement is transmitted from an RFID reader/writer.

As shown in the examples described above, the possibility that RFID is abused by a malevolent person is necessary to be avoided as an overall system of RFID.

According to such a background, it is proposed that operation of an RFID chip is stopped after a product is purchased (refer to Non-Patent Document 1: "IC tag, assignment for progress", Nikkei Byte (published by Nikkei Business Publications, Inc.), May 2003, p. 78).

DISCLOSURE OF INVENTION

As described above, in a case where an RFID chip receives an instruction for stopping operation, it is necessary to permanently maintain information for stopping operation from that point.

As an RFID chip which is used for commercial distribution, a passive RFID chip, which does not basically have a power source and generates a power source from magnetic field generated by an RFID reader/writer, is supposed. Therefore, it is necessary to maintain information even if there is no power source.

Therefore, a method for maintaining a state by an EEPROM or the like is conceivable. However, a high voltage is necessary for writing a value into an EEPROM, and a large boosting circuit is necessary only for stopping operation.

In addition, an EEPROM is basically rewritable; therefore, there is physically a possibility that an operation-stop state is cancelled.

It is an object of the present invention to efficiently mount an RFID chip with a register for maintaining a setting to stop operation in which there is physically no possibility that an operation-stop function is cancelled.

In view of the foregoing problems, one feature of the present invention is to have safety mechanism as a system, by which RFID can be put into an operation-stop state when the RFID is determined that it is not necessary to receive a requirement from a reader/writer in consideration of existence of an attacker to an RFID system.

An RFID system using an RFID chip of the present invention has an operation-stop instruction in an instruction set.

An RFID chip of the present invention has a memory circuit, and a register which maintains a setting of operation-stop is provided inside the memory circuit.

When an operation-stop instruction is received from an RFID reader/writer, an RFID chip of the present invention decodes the instruction by a control circuit and conducts the operation-stop instruction. At this time, the control circuit writes a value of operation-stop to a register which maintains a setting of operation-stop.

An RFID chip of the present invention has a feature to use a register which has a write-once function and does not return to an original state physically if a value is written once such as an organic memory as a register which maintains a setting whether there is an operation-stop or not.

Accordingly, there is no possibility to return to a state where operation can be physically conducted, and operation can be stopped more certainly than a case of using a rewritable memory such as an EEPROM.

Hereinafter, a specific structure of the present invention will be shown.

A semiconductor device of the present invention has an antenna, a memory cell, and a control circuit, where the memory cell has a memory material layer between electrodes which are provided so as to oppose to each other, the control circuit has a means for storing an instruction received from the antenna as data in the memory cell by changing physical characteristics of the memory cell, and physical characteristics of the memory cell are not changed reversibly.

A semiconductor device of the present invention has an antenna, a memory circuit including a memory cell array having a plurality of memory cells, and a control circuit, where the memory cell array includes a plurality of bit lines extending in a first direction and a plurality of word lines extending in a perpendicular direction to the first direction, a memory cell is formed at each intersection of the bit line and the word line, a memory material layer is provided between the bit line and the word line of the memory cell, the control circuit has a means for storing an instruction received from the antenna as data by changing physical characteristics of the memory cell, and physical characteristics of the memory cell are not changed reversibly.

In the structure described above of a semiconductor device of the present invention, the instruction stops operation of the semiconductor device.

A semiconductor device of the present invention has a circuit having an antenna, a memory circuit having a ROM and a RAM, a receiving circuit which stores an instruction received from the antenna as data in the RAM, a transmitting circuit which transmits the data taken from the RAM to the circuit having the antenna, and a control circuit, where the ROM has a memory cell, the memory cell has a memory material layer between electrodes which are provided so as to oppose to each other, the control circuit has a means for reading data from the RAM in which an operation-stop instruction received from the antenna is stored as data and storing as data in the memory cell by changing physical characteristics of the memory cell, and physical characteristics of the memory cell is not changed reversibly.

A semiconductor device of the present invention has a circuit having an antenna, a memory circuit having a ROM and a RAM, a receiving circuit which stores an instruction received from the antenna as data in the RAM, a transmitting circuit which transmits the data taken from the RAM to the circuit having the antenna, and a control circuit, where the ROM has a memory cell array having a plurality of memory cells, the memory cell array includes a plurality of bit lines extending in a first direction and a plurality of word lines extending in a perpendicular direction to the first direction, a memory cell is formed at each intersection of the bit line and the word line, a memory material layer is provided between the bit line and the word line of the memory cell, the control circuit has a means for reading data from the RAM in which an operation-stop instruction received from the antenna is stored as data and storing as data in the memory cell by changing physical characteristics of the memory cell, and physical characteristics of the memory cell is not changed reversibly.

In the structure described above of a semiconductor device of the present invention, the operation-stop instruction stops operation of the control circuit.

In the structure described above of a semiconductor device of the present invention, the physical characteristics of the memory cell are changed by an electric effect, an optical effect, or a thermal effect to the memory material layer.

In the structure described above of a semiconductor device of the present invention, the physical characteristics are resistance characteristics.

In the structure described above of a semiconductor device of the present invention, an inorganic material is used for the memory material layer.

In the structure described above of a semiconductor device of the present invention, an organic material is used for the memory material layer.

In the structure described above of a semiconductor device of the present invention, a light emitting material is used for the memory material layer.

In the structure described above of a semiconductor device of the present invention, metal oxide is included in the memory material layer.

A communication distance of RFID tends to be rapidly increased by technical innovation in recent years, and it is easily presumed that the communication distance is further increased continuously. Accordingly, a new usage appears, which makes life convenient rapidly. On the other hand, it is necessary to consider disadvantage as well as advantage, as the communication distance is increased.

According to the present invention, a system in consideration of existence of an attacker to an RFID system can be designed, and an RFID system which is more safety and ensures privacy can be provided by an easier and reliable method.

BEST MODE FOR CARRYING OUT THE INVENTION

Figure 1:
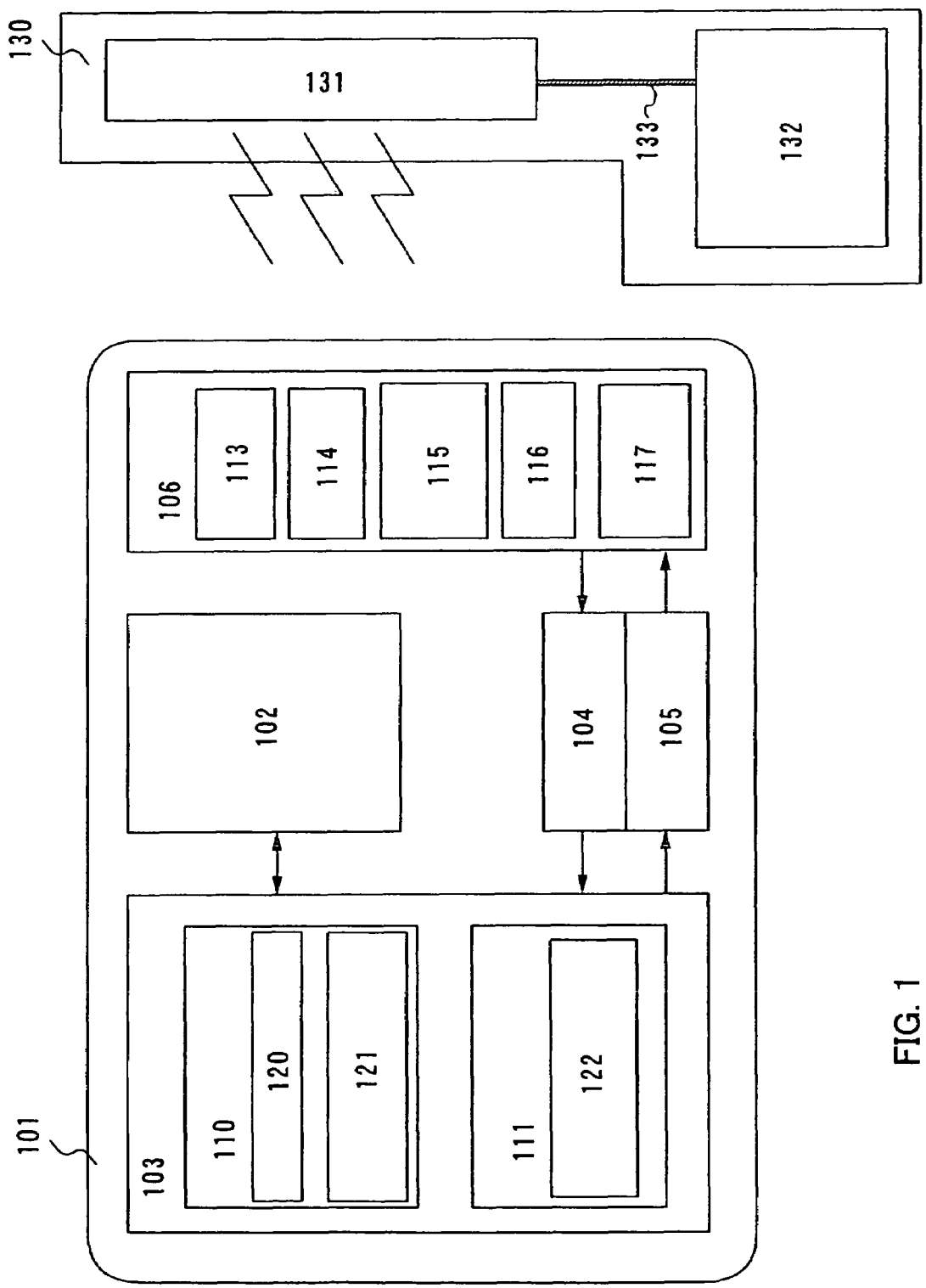
FIG. 1 is a diagram showing a configuration of an RFID chip of the present invention.

Hereinafter, embodiment modes of the present invention will be explained with reference to the drawings. However, it is easily understood by those skilled in the art that embodiments and details herein disclosed can be modified in various ways without departing from the purpose and the scope of the present invention. Therefore, it should be noted that the description of embodiment modes should not be interpreted as limiting the present invention. It is to be noted that that identical portions or portions having the same function in all figures for explaining embodiment modes are denoted by the same reference numerals and will not be further explained.

Embodiment Mode 1

In this embodiment mode, a configuration of an RFID chip will be explained. In addition, a device using a semiconductor element like an RFID chip of the present invention can be referred to as a semiconductor device.

As shown in FIG. 1, an RFID chip 101 of the present invention includes a control circuit 102, a memory circuit 103, a receiving circuit 104, a transmitting circuit 105, and an RF circuit 106. The memory circuit 103 is formed by a RAM (Random Access Memory) 110 and a ROM (Read Only Memory) 111. The RAM 110 includes a data register 120 formed by an SRAM and the like, and a standby register 121. The ROM 111 includes an operation-stop register 122 having a memory element such as a write-once memory, information specific to RFID, program used in the control circuit, and the like. The RF circuit 106 includes a resonant circuit 113, a power supply circuit 114, a clock generation circuit 115, a demodulation circuit 116, and a modulation circuit 117. The RFID chip 101 is not limited to the aforementioned configuration, and a congestion control circuit and the like may be included. Further, the resonant circuit 113 has an antenna. Furthermore, a condenser may be provided for the resonant circuit 113 to conduct resonance by the antenna and the condenser.

In the RFID chip 101 of the present invention, if an electric wave emitted from an antenna 131 of an RFID reader/writer 130 is received in the resonant circuit 113, a power supply potential is generated in the power supply circuit 114. Further, information is demodulated from the received electric wave in the demodulation circuit 116. The information is transmitted by the modulation circuit 117. In this manner, the information can be transmitted and received by wireless communication between the RFID reader/writer 130 and the RFID chip 101.

The antenna 131 of the RFID reader/writer is connected to an information processor 132 through a communication line 133. Accordingly, information can be transmitted and received between the RFID chip 101 and the RFID reader/writer 130 under the control of the information processor 132. It is to be noted that information may be exchanged between the antenna 131 and the information processor 132 by wireless communication such as infrared communication.

The resonant circuit 113 receives an electric wave emitted from the antenna 131 of the RFID reader/writer, and an alternating signal is generated at both ends of the antenna of the resonant circuit 113. The alternating signal which is generated becomes power of the RFID chip 101, and includes information such as an instruction to be transmitted from the antenna 131 of the RFID reader/writer. In the power supply circuit 114, the alternating signal generated in the resonant circuit 113 is rectified with a diode and smoothed using a capacitor, and accordingly, a power supply potential is generated and supplied to each circuit. The clock generation circuit 115 generates clock signals having various frequency in accordance with the alternating signal generated in the resonant circuit 113. The demodulation circuit 116 demodulates information included in the alternating signal generated in the resonant circuit.

The receiving circuit 104 receives data demodulated by the demodulation circuit 116 and writes the data into the data register 120. At the point of terminating the writing, 1 is written into the standby register 121. The control circuit 102 starts operation at the point when the receiving circuit 104 writes 1 into the standby register. The control circuit 102 analyzes an instruction from the data received from the data register and conducts a series of operations in accordance with the instruction. In addition, a circuit which checks whether the demodulated signal is accurate or not may also be provided. Then, after a writing instruction is transmitted to the data register 120 and data of an arithmetic result in accordance with the instruction is stored in the data register 120, 1 is written into the standby register 121. The control circuit 102 can transmit a reading instruction to the memory circuit 103 and data can be read. In the transmitting circuit 105, at the point when the control circuit 102 writes 1 into the standby register 121, data is received from the data register and outputted to the modulation circuit 117.

The operation-stop register 122 is provided with a write-once memory. The control circuit 102 is set so as to check a value of the operation-stop register 122 every time when the control circuit 102 starts operation. In a case where the value of the operation-stop register 122 is 0, the control circuit 102 starts a processing. Alternatively, in a case where the value of the operation-stop register 122 is 1, the control circuit 102 stops a processing.

The data register 120 and the standby register 121 are provided with a rewritable memory such as an SRAM. A rewritable nonvolatile memory may be provided, if necessary.

Although an example is explained in this embodiment mode, in which power is supplied to the RFID chip 101 from the antenna 131 of the RFID reader/writer 130, the present invention is not limited to this mode. For example, the RFID chip 101 can include a battery or the like internally so as to supply power, and information can be only transmitted and received wirelessly between the antenna 131 of the RFID reader/writer 130 and the RFID chip 101.

Embodiment Mode 2

In this embodiment mode, a normal operation of an RFID chip 101 will be explained.

The RFID chip 101 receives and demodulates an instruction in an RF circuit 106 and transmits it to a receiving circuit 104. The receiving circuit 104 writes the demodulated data into a data register 120 inside a memory circuit 103, and then writes 1 into a standby register 121 to show that writing of data is terminated. A control circuit 102 confirms a value of an operation-stop register 122 when it is confirmed that the writing into the standby register 121 by the receiving circuit 104 is terminated.

The control circuit 102 confirms that a value of the operation-stop register 122 is 0, and starts a reading processing from the data register 120. At this time, the control circuit 102 analyzes an instruction from the data which is read, and conducts the instruction. Then, a result thereof is written into the data register 120, and at the point of terminating the writing of all values, a value is written into the standby register 121. A transmitting circuit 105 confirms that a value is written into the standby register 121 by the control circuit 102, and takes into the data from the data register to transmit it to the RF circuit 106. The RF circuit 106 modulates the data which is received from the transmitting circuit 105 and transmits the data to an RFID reader/writer through an antenna of the RF circuit.

Embodiment Mode 3

For example, in a case where RFID is used for product management, there is a possibility that information stored in an RFID chip 101 is not necessary at the point when a customer purchases a product. In this embodiment mode, operation will be explained, in which an operation-stop instruction is transmitted from an RFID reader/writer 130 to the RFID chip 101 when a product is purchased so that the RFID chip 101 does not respond even if any instruction is received from the RFID reader/writer thereafter.

The RFID chip 101 receives and demodulates an operation-stop instruction in an RF circuit 106 and transmits it to a receiving circuit 104. The receiving circuit 104 writes the demodulated data into a data register 120 inside a memory circuit 103, and writes 1 into a standby register 121 to show that writing of data is terminated. A control circuit 102 confirms a value of an operation-stop register 122 at the point when it is confirmed that the writing into the standby register 121 by the receiving circuit 104 is terminated.

The control circuit 102 confirms that a value of the operation-stop register 122 is 0, and starts a reading processing from the data register 120. At this time, the control circuit 102 analyzes data, which is read, to be an operation-stop instruction, and writes a value 1 into the operation-stop register 122 inside the memory circuit. Accordingly, thereafter, the RFID chip 101 does not respond even if an instruction is received from the RFID reader/writer 130. In this embodiment mode, a case where the operation-stop register is 1-bit is explained; however, the operation-stop register is not necessary to be 1-bit, and the number of bits may be changed, if necessary.

Embodiment Mode 4

In this embodiment mode, operation will be explained, in which a value of a operation-stop register 122 inside an RFID chip 101 is set to 1 so that the RFID chip 101 does not respond even if an instruction is received from an RFID reader/writer.

The RFID chip 101 receives and demodulates an instruction in an RF circuit 106 and transmits it to a receiving circuit 104. The receiving circuit 104 writes the demodulated data into a data register 120 inside a memory circuit 103, and then writes 1 into a standby register 121 to show that writing of data is terminated. A control circuit 102 confirms a value of the operation-stop register 122 at the point when it is confirmed that the writing into the standby register 121 by the receiving circuit 104 is terminated.

The control circuit 102 confirms that the value of the operation-stop register 122 is 1, at which point a processing is stopped.

Embodiment Mode 5

Figure 2:
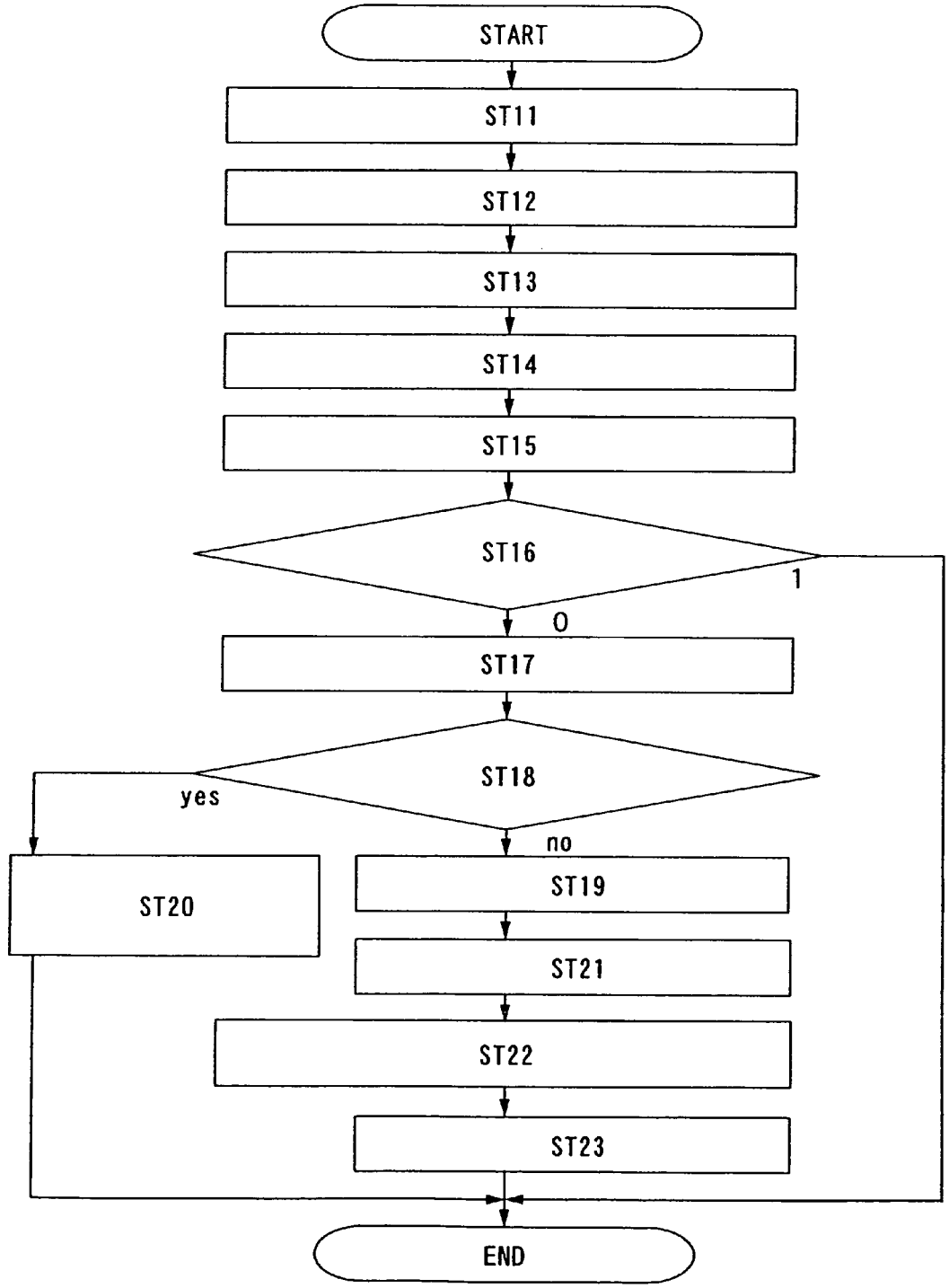
FIG. 2 is a flowchart showing a flow of operation of an RFID chip of the present invention.

FIG. 2 is a flowchart showing procedure of an RFID chip 101 in this embodiment mode. When the RFID chip 101 receives an instruction from an RFID reader/writer 130 in a step ST11, a power source is generated in a power supply circuit 114, a clock is generated in a clock generation circuit 115, and information is demodulated from the received electric wave into a digital data in the demodulation circuit 116 in a step ST12.

Next, when a receiving circuit 104 receives the data from the demodulation circuit 116 in a step ST13, the received data is written into a data register 120 in a step ST14, and when the writing of data is terminated, 1 is written into a standby register 121 in a step ST15.

Subsequently, in a step ST16, a control circuit 102 reads a value of an operation-stop register 122 after a value is written into the standby register 121. In a case where the value of the operation-stop register is 1, the control circuit 102 stops a processing at that point. Alternatively, in a case where the value of the operation-stop register is 0, the control circuit 102 starts a processing.

Then, in a step ST17, the control circuit 102 reads data from the data register 120 and analyzes an instruction from the data.

In a case where the instruction is an operation-stop instruction (yes) in a step ST18, the control circuit 102 writes 1 into the operation-stop register 122 in a step ST20 and a processing is terminated so that, thereafter, the RFID chip 101 does not respond even if an instruction is received from the RFID reader/writer 130.

In a case where the instruction is not an operation-stop instruction (no) in the step ST18, the control circuit 102 conducts a processing in accordance with the instruction, and a processing result is written into the data register 120 in a step ST19.

In a step ST21, at the point of terminating writing of data into the data register 120, the control circuit 102 writes 1 into the standby register 121, which tells a transmitting circuit 105 that a processing is terminated.

In a step ST22, at the point when the control circuit 102 writes a value into the standby register 121, the transmitting circuit 105 takes data from the data register 120 and transmits it to the modulation circuit 117.

In a step ST23, the modulation circuit 117 modulates the received data and transmits a modulated signal to a resonant circuit 113. The resonant circuit 113 transmits a processing result from an antenna to a reader/writer by resonating the modulated data. With the above, a series of processing of the RFID chip 101 is terminated.

Embodiment Mode 6

In this embodiment mode, a ROM 111 included in an RFID chip 101, and an operation method thereof will be explained.

Figure 3:
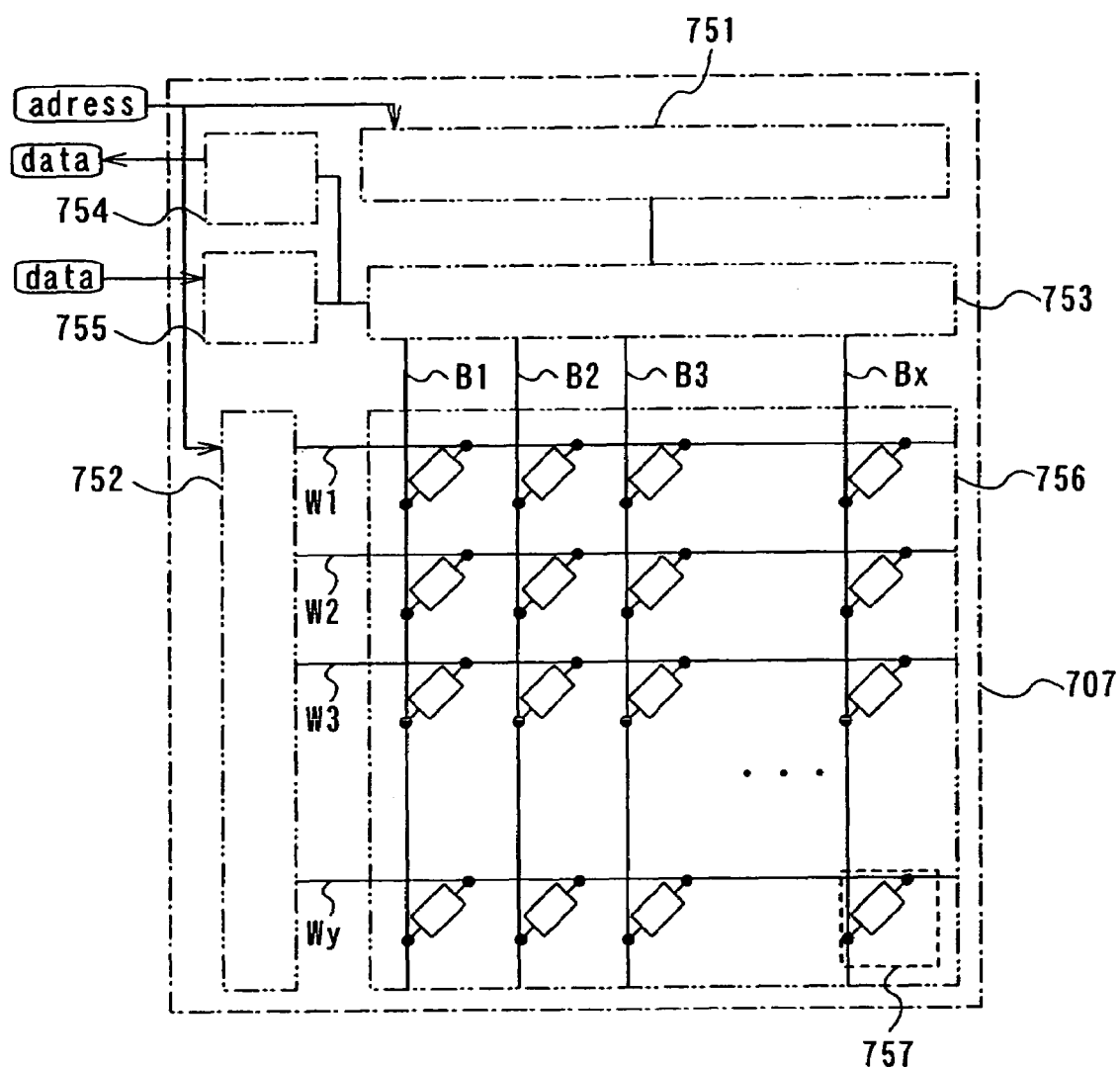
FIG. 3 is a diagram showing a memory of the present invention.

A configuration of the ROM 111 in FIG. 1 will be explained using a ROM 707 in FIG. 3. The ROM 707 has a memory cell array 756 in which a memory element is formed and a driver circuit. The driver circuit includes a column decoder 751, a row decoder 752, a reading circuit 754, a writing circuit 755, and a selector 753.

The memory cell array 756 has a bit line Bm (m=1 to x), a word line Wn (n=1 to y), and a memory cell 757 at each intersection of the bit line and the word line. It is to be noted that the memory cell 757 may be either an active type to which a transistor is connected or a passive type formed of only a passive element. Further, the bit line Bm is controlled by the selector 753 while the word line Wn is controlled by the row decoder 752.

The column decoder 751 receives an address signal for specifying an arbitrary bit line and transmits the signal to the selector 753. The selector 753 receives the signal of the column decoder 751 and selects a specified bit line. The row decoder 752 receives an address signal for specifying an arbitrary word line and selects a specified word line. As a result of the aforementioned operation, one memory cell 757 corresponding to the address signals is selected. The reading circuit 754 reads and outputs information included in the selected memory cell. The writing circuit 755 generates a voltage required for writing, and applies the voltage to the selected memory cell, thereby writing the data.

Next, a circuit configuration of the memory cell 757 will be explained. In this embodiment mode, a memory cell having a memory element 783 having a lower electrode and an upper electrode, and a memory material layer which is interposed between the pair of electrodes will be explained.

Figure 4A:
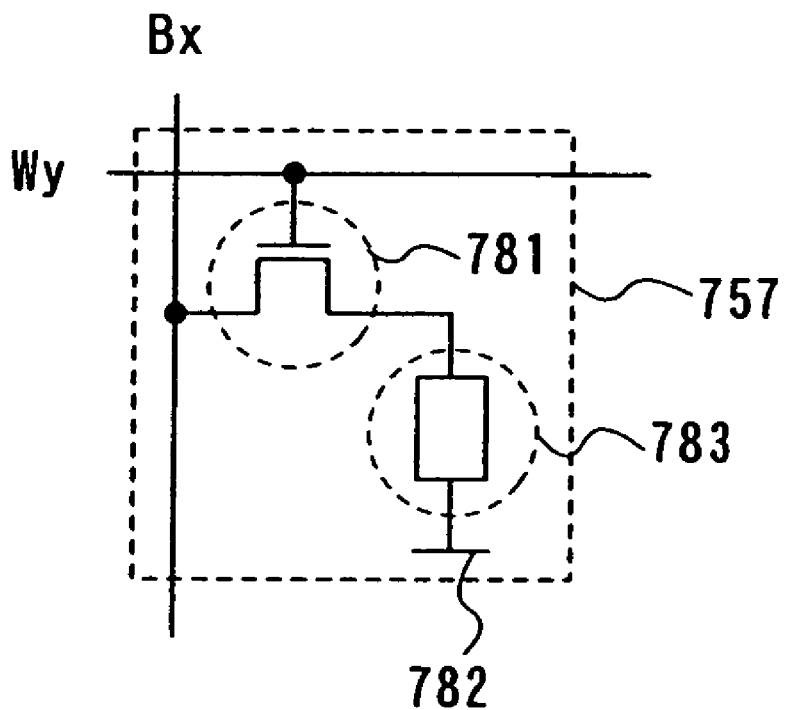
FIGS. 4A and 4B are diagrams each showing a memory element of the present invention.

A memory cell 757 shown in FIG. 4A is an active type memory cell having a transistor 781 and a memory element 783. A thin film transistor can be applied to the transistor 781. A gate electrode included in the transistor 781 is connected to a word line Wy. One of a source electrode and a drain electrode included in the transistor 781 is connected to a bit line Bx and the other is connected to the memory element 783. The lower electrode of the memory element 783 is electrically connected to one of the source electrode and the drain electrode of the transistor 781. The upper electrode (corresponding to reference numeral 782) of the memory element 783 can be shared between the memory elements, as a common electrode.

Figure 4B:
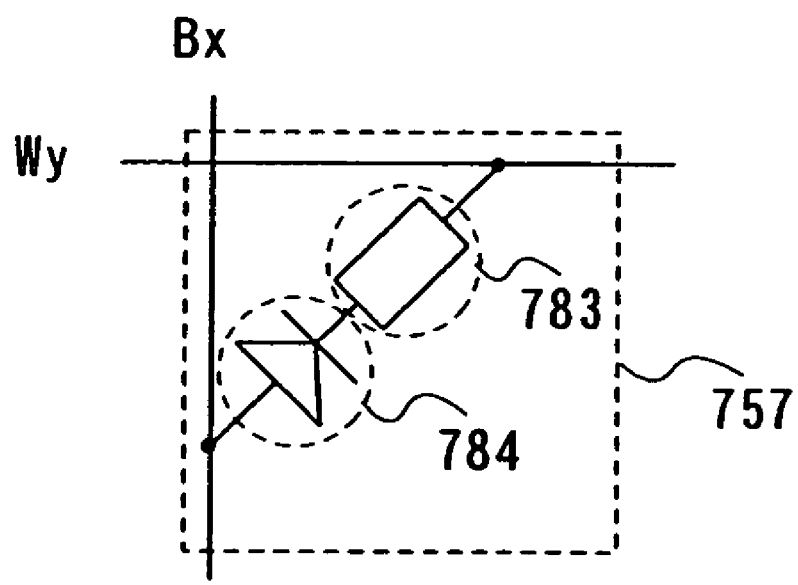

As shown in FIG. 4B, a configuration in which the memory element 783 is connected to a diode 784 may be employed as well. The diode 784 can adopt a so-called diode connection structure in which one of a source electrode and a drain electrode of a transistor is connected to a gate electrode thereof. Further, as the diode 784, a Schottky diode formed by having contact between a memory material layer and a lower electrode may be also used, or a diode or the like formed by stacking a memory material may also be used.

For the memory material layer, a material of which the property or state is changed by an electric effect, an optical effect, a thermal effect, or the like can be used. For example, a material of which a property or a state is changed by fusion due to Joule heating, dielectric breakdown, or the like so that the lower electrode and the upper electrode can be short-circuited, may be used. Thus, the thickness of the memory material layer may be 5 to 100 nm, preferably 10 to 60 nm. For such a memory material layer, an inorganic material or an organic material can be used, and the memory material layer can be formed by an evaporation method, a spin-coating method, a droplet discharging method, or the like.

As the inorganic material, silicon oxide, silicon nitride, silicon oxynitride, and the like are given. Even in the case of such an inorganic material, dielectric breakdown can be caused by controlling a thickness thereof, so that the lower electrode and the upper electrode can be short-circuited.

As the organic material, for example, an aromatic amine-based compound (namely a substance having a bond of benzene ring-nitrogen) such as 4,4'-bis[N-(1-napthyl)-N-phenyl-amino]-biphenyl (abbreviation: α-NPD), 4,4'-bis[N-(3-methylphenyl)-N-phenyl-amino]-biphenyl (abbreviation: TPD), 4,4',4''-tris(N,N-diphenyl-amino)-triphenylamine (abbreviation: TDATA), 4,4',4''-tris[N-(3-methylphenyl)-N-phenyl-amino]-triphenylamine (abbreviation: MTDATA), or 4,4'-bis(N-(4-(N,N-di-m-tolylamino)phenyl)-N-phenylamino)biphenyl (abbreviation: DNTPD); polyvinylcarbazole (abbreviation: PVK); a phthalocyanine compound such as phthalocyanine (abbreviation: $H_2Pc$), copper phthalocyanine (abbreviation: CuPc), or vanadyl phthalocyanine (abbreviation: VOPc); or the like can be used. These materials are substances having a high hole transporting property.

Further, as the organic compound, for example, a material made of a metal complex or the like having a quinoline skeleton or a benzoquinoline skeleton such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), or bis(2-methyl-8-quinolinolato)-4-phenylphenolato-aluminum (abbreviation: BAlq); or a material made of a metal complex or the like having an oxazole-based or thiazole-based ligand such as bis[2-(2-hydroxyphenyl)benzoxazolato]zinc (abbreviation: $Zn(BOX)_2$) or bis[2-(2-hydroxyphenyl)benzothiazolato]zinc (abbreviation: $Zn(BTZ)_2$) can be used. These materials are substances having a high electron transporting property.

In addition to a metal complex, a compound or the like such as 2-(4-biphenylyl)-5-(4-tert-buthylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-buthylphenyl)-4-phenyl-5-(4-biphenylyl)-1,2,4-triazole (abbreviation: TAZ), 3-(4-tert-buthylphenyl)-4-(4-ethylphenyl)-5-(4-biphenylyl)-1,2,4-triazole (abbreviation: p-EtTAZ), bathophenanthroline (abbreviation: BPhen), or bathocuproin (abbreviation: BCP) can be used.

The memory material layer may be a single layer structure or a stacked structure. In a case of a stacked structure, the stacked structure can be formed by selecting from the materials described above. In addition, the organic material described above and a light emitting material may be stacked. As the light emitting material, 4-(dicyanomethylene)-2-methyl-6-[2-(1,1,7,7-tetramethyljulolidin-9-yl)ethenyl]-4H-pyran, (abbreviation: DCJT), 4-(dicyanomethylene)-2-tert-butyl-6-[2-(1,1,7,7-tetramethyljulolidin-9-yl)ethenyl]-4H-pyran, periflanthene, 1,4-bis[2-(10-methoxy-1,1,7,7-tetramethyljulolidin-9-yl)ethenyl]-2,5-dicyanobenzene, N,N'-dimethylquinacridone (abbreviation: DMQd), coumarin 6, coumarin 545T, tris(8-quinolinolato)aluminum (abbreviation: $Alq_3$), 9,9'-bianthryl, 9,10-diphenylanthracene (abbreviation: DPA), 9,10-bis(2-naphthyl)anthracene (abbreviation: DNA), 2,5,8,11-tetra-t-butylperylene (abbreviation: TBP), and the like are given.

In addition, a layer in which the light emitting material is dispersed may be used. In the layer in which the light emitting material is dispersed, the following materials can be used: an anthracene derivative such as 9,10-di(2-naphthyl)-2-tert-butylanthracene (abbreviation: t-BuDNA); a carbazole derivative such as 4,4'-bis(N-carbazolyl)biphenyl (abbreviation: CBP); a metal complex such as bis[2-(2-hydroxyphenyl)pyridinato]zinc (abbreviation: $Znpp_2$), bis[2-(2-hydroxyphenyl)benzoxazolato]zinc (abbreviation: ZnBOX); or the like. In addition, tris(8-quinolinolato)aluminum (abbreviation: $Alq_3$), 9,10-bis(2-naphthyl)anthracene (abbreviation: DNA), bis(2-methyl-8-quinolinolato)-4-phenylphenolato-aluminum (abbreviation: BAlq), or the like can be used.

The organic material described above preferably has a glass transition temperature (Tg) from 50° C. to 300° C., preferably 80° C. to 120° C., so that the property of the organic material is changed by a thermal effect or the like.

Further, a material in which metal oxide is mixed into an organic material or a light emitting material may be used. The material in which metal oxide is mixed includes a state of mixing or stacking the organic material or the light emitting material and the metal oxide. Specifically, the material in which metal oxide is mixed indicates a state of being formed by a co-evaporation method using a plurality of evaporation sources. Such a material can be referred to as an organic-inorganic composite material.

For example, in a case of mixing a substance having a high hole transporting property with metal oxide, it is preferable to use vanadium oxide, molybdenum oxide, niobium oxide, rhenium oxide, tungsten oxide, ruthenium oxide, titanium oxide, chromium oxide, zirconium oxide, hafnium oxide, or tantalum oxide as the metal oxide.

In a case of mixing a substance having a high electron transporting property with metal oxide, it is preferable to use lithium oxide, calcium oxide, sodium oxide, potassium oxide, or magnesium oxide as the metal oxide.

A material of which the property is changed by an electric effect, an optical effect, or a thermal effect may be used for the memory material layer; therefore, for example, a conjugated polymer doped with a compound (photoacid generator) generating acid by absorbing light can also be used. Here, polyacetylenes, polyphenylenevinylenes, polythiophenes, polyanilines, polyphenylene ethynylenes, or the like can be used as the conjugated polymer. In addition, as the photoacid generator, aryl sulfonium salt, aryl iodonium salt, o-nitrobenzyl tosylate, aryl sulfonic acid p-nitrobenzyl ester, sulfonyl acetophenones, Fe-arene complex PF6 salt, or the like can be used.

Next, operation at the time of writing information in the active type memory cell 757 shown in FIG. 4A will be explained. In this embodiment mode, a value stored in a memory element at an initial state is denoted by "0" and a value stored in a memory element of which the characteristics are changed by an electric effect or the like is denoted by "1". The memory element at an initial state has a high resistance value while the memory element after the change has a low resistance value.

In a case where writing is conducted, a bit line Bm in an m-th column and a word line Wn in an n-th row are selected by the column decoder 751, the row decoder 752, and the selector 753, thereby turning on the transistor 781 included in the memory cell 757 in the m-th column and the n-th row.

Subsequently, a predetermined voltage is applied to the bit line Bm in the m-th column by the writing circuit 755 in a predetermined period. A voltage and time for the application is determined according to such a condition that a state of the memory element 783 is changed from an initial state to a state with a low resistance value. The voltage applied to the bit line Bm in the m-th column is transmitted to the lower electrode of the memory element 783, which results in potential difference between the lower electrode and the upper electrode. Then, current flows to the memory element 783, a state of the memory material layer is changed, and characteristics of the memory element are changed. Accordingly, a value stored in the memory element 783 is changed from "0" to "1".

Such a writing operation is conducted in accordance with the control circuit 102.

Figure 5:
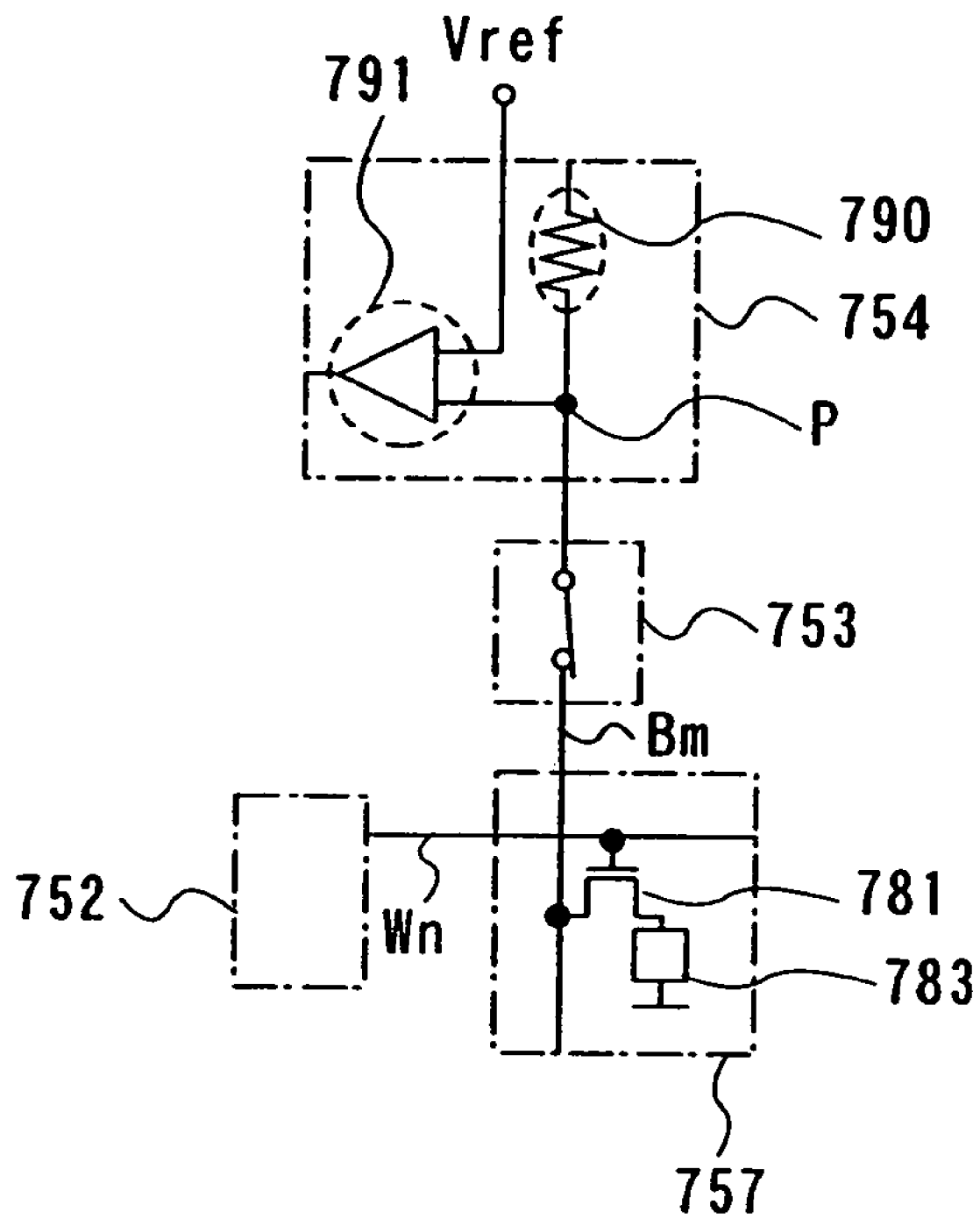
FIG. 5 is a diagram showing operation of a memory of the present invention.

Next, operation of reading information will be explained. As shown in FIG. 5, the reading circuit 754 has a resistance element 790 and a sense amplifier 791. Information is read by applying a voltage between the lower electrode and the upper electrode to determine whether the memory element is at an initial state or a low-resistance state after the change. In specific, information can be read by a resistance dividing method.

For example, a case will be explained, where information in the memory element 783 in the m-th column and the n-th row is read from a plurality of the memory elements 783 included in the memory cell array 756. First, the bit line Bm in the m-th column and the word line Wn in the n-th row are selected by the column decoder 751, the row decoder 752, and the selector 753. Thus, the transistor 781 included in the memory cell 757 arranged in the m-th column and the n-th row is turned on, and thus, the memory element 783 and the resistance element 790 are connected in series. Accordingly, a potential at a point P shown in FIG. 5 is determined in accordance with current characteristics of the memory element 783.

The potential at the point P in the case where the memory element is at the initial state is referred to as V1, and the potential at the point P in the case where the memory element is at the low-resistance state after the change is referred to as V2. By using a reference potential Vref which satisfies V1>Vref>V2, information stored in the memory element can be read. In specific, in the case where the memory element is at the initial state, an output potential of the sense amplifier 791 becomes Lo. On the other hand, in the case where the memory element is at the low-resistance state, an output potential of the sense amplifier 791 becomes Hi.

According to the aforementioned method, the information is read with a voltage value by using resistance division and a difference in a resistance value of the memory element 783. Alternatively, the information in the memory element 783 may be read with a current value. It is to be noted that the reading circuit 754 of the present invention is not limited to the aforementioned configuration. Any configuration may be used for the reading circuit 754 as long as the information in the memory element can be read.

The memory element having such a configuration changes a state from "0" to "1". The change from "0" to "1" is irreversible; therefore, the memory element becomes a write-once memory element.

An identification number of an RFID chip can be written into such a memory element 783. The written information can be read by wireless communication from a sensor provided for a telephone terminal, namely an antenna.

It is to be noted that this embodiment mode can be implemented by being freely combined with the embodiment mode described above.

Embodiment Mode 7

In this embodiment mode, a cross-sectional view of a memory circuit 103 will be explained.

Figure 6A:
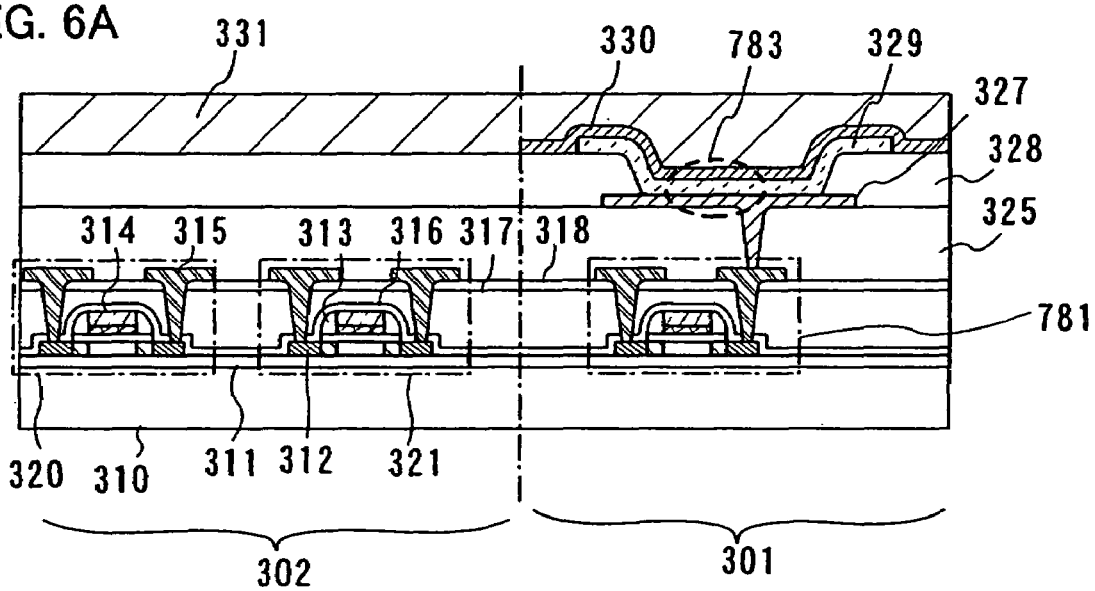
FIGS. 6A and 6B are cross-sectional views each showing a memory of the present invention.

FIG. 6A is a cross-sectional view of a memory element in which a memory cell portion 301 and a driver circuit portion 302 are integrated over an insulating substrate 310. As the insulating substrate 310, a glass substrate, a quartz substrate, a substrate made of silicon, a metal substrate, a plastic substrate, or the like can be used.

A base film 311 is provided over the insulating substrate 310. Thin film transistors 320 and 321 are provided through the base film 311 between each of the thin film transistors 320 and 321 and the insulating substrate 310 in the driver circuit portion 302, and a transistor 781 is provided by interposing the base film 311 between the transistor 781 and the insulating substrate 310 in the memory cell portion 301. Each thin film transistor is provided with a semiconductor film 312 formed to have an island shape, a gate electrode 314 provided by interposing a gate insulating film, an insulator (a so-called sidewall) 313 provided over a side surface of the gate electrode, and a gate electrode 314. The semiconductor film 312 is formed to have a thickness of 0.2 μm or less, typically 40 nm to 170 nm, and preferably 50 nm to 150 nm. Further, an insulating film 316 covering the insulator 313 and the semiconductor film 312, and an electrode 315 to be connected to an impurity region formed in the semiconductor film 312 are provided. The electrode 315 can be formed by forming a contact hole in the gate insulating film and the insulating film 316, forming a conductive film in the contact hole, and patterning the conductive film so as to be connected to the impurity region.

Amorphous silicon or polycrystalline silicon can be used for the semiconductor film. In a case of using polycrystalline silicon, polycrystalline silicon can be formed by forming amorphous silicon first and conducting heat treatment or laser irradiation. At this time, by conducting heat treatment or laser irradiation using a metal element typified by nickel, crystallization temperature can be lowered. A laser irradiation apparatus of continuous oscillation or pulsed oscillation can be used for the laser irradiation. In addition, a crystallization method with heat treatment and a crystallization method of conducting irradiation of a continuous wave laser or a laser beam which oscillates at a frequency of 10 MHz or more may be combined. By the irradiation of the continuous wave laser or laser beam which oscillates at a frequency of 10 MHz or more, a surface of the crystallized semiconductor film can be planarized. Accordingly, the gate insulating film can also be thinned, and it can contribute to the enhancement of withstand voltage of the gate insulating film.

Further, a semiconductor film, which is obtained by conducting scanning in one direction while irradiation of the continuous wave laser or laser beam which oscillates at a frequency of 10 MHz or more is conducted with respect to a semiconductor film to be crystallized, has characteristics that a crystal is grown in a scanning direction of the beam. By arranging a transistor by setting the scanning direction to a channel length direction (a direction in which carriers flow when a channel forming region is formed) and combining a gate insulating film which will be shown below, a transistor (TFT) with small variation in characteristics and high electron field-effect mobility can be obtained.

In a thin film transistor which forms a wireless chip of the present invention, the insulating film typified by the gate insulating film or the like can be manufactured by oxidizing or nitriding a surface to be formed using high-density plasma treatment. High-density plasma treatment is such a plasma treatment that the plasma density is $1 \times 10^{11}$ cm$^{-3}$ or more, and preferably $1 \times 10^{11}$ cm$^{-3}$ or more but $9 \times 10^{15}$ cm$^{-3}$ or less, and a high frequency wave such as a microwave (for example, a frequency of 2.45 GHz) is used. In a case where plasma is generated under such a condition, the low electron temperature becomes 0.2 eV or more but 2 eV or less. The high-density plasma having a feature of low electron temperature as described above has a low kinetic energy of activated species; therefore, a film can be formed to have a little plasma damage and a few defects. In a case of forming an insulating film over an object to be formed, a substrate over which a patterned semiconductor film is formed as an object to be formed is disposed in a film formation chamber capable of such plasma treatment. Then, the distance between an electrode for generating plasma, namely an antenna and the object to be formed is set to be 20 mm or more but 80 mm or less, preferably 20 mm or more but 60 mm or less to perform the film formation treatment to the object to be formed. Such high-density plasma treatment enables a low temperature process (substrate temperature of 400° C. or less) to be achieved. Therefore, plastic of which heat resistance is low can be used as the substrate.

As a film-formation atmosphere of such an insulating film, a nitrogen atmosphere or an oxygen atmosphere can be used. The nitrogen atmosphere is typically a mixed atmosphere of nitrogen and a rare gas or a mixed atmosphere of nitrogen, hydrogen, and a rare gas. As the gas having nitrogen and hydrogen, ammonia can be given. As the rare gas, at least one of helium, neon, argon, krypton, and xenon can be used. The oxygen atmosphere is typically a mixed atmosphere of oxygen and a rare gas, a mixed atmosphere of oxygen, hydrogen, and a rare gas, or a mixed atmosphere of dinitrogen monoxide and a rare gas. As the rare gas, at least one of helium, neon, argon, krypton, and xenon can be used. In addition, a mixed atmosphere of hydrogen and a rare gas may be used.

The surface to be formed can be oxidized or nitrided by oxygen radical (which contains OH radical in some cases) or nitrogen radical (which contains NH radical in some cases) generated by the high-density plasma.

By such high-density plasma treatment, an insulating film having a thickness of 1 to 20 nm, typically 5 to 10 nm, can be formed. A reaction in this case is a solid-phase reaction; therefore, interface state density between the insulating film and the semiconductor film can be extremely lowered. In a case where an insulating film is formed over a surface of the semiconductor film (crystalline silicon or polycrystalline silicon) by oxidizing or nitriding the surface of the semiconductor film by high-density plasma treatment, variation in a thickness of the insulating film formed over the surface of the semiconductor film can be made to be extremely small. In addition, in a case of crystalline silicon, oxidization is not conducted more than necessary in a crystal grain boundary; therefore, a very favorable state can be obtained. In other words, by conducting solid phase oxidization to a surface of the semiconductor film by high-density plasma treatment shown here, an insulating film with favorable uniformity and low interface state density can be formed without conducting oxidation reaction more than necessary in a crystal grain boundary.

The insulating film thus formed does not damage another coating film so much and can be dense. In addition, the insulating film formed by the high-density plasma treatment can improve the state of an interface which is in contact with the insulating film. For example, if the gate insulating film is formed using the high-density plasma treatment, the state of the interface with the semiconductor film can be improved. Consequently, the electrical characteristics of a thin film transistor can be enhanced.

A case where the high-density plasma treatment is used for manufacturing the insulating film is explained; however, the high-density plasma treatment may be conducted to the semiconductor film as well. By the high-density plasma treatment, modification of a surface of the semiconductor film can be conducted. Consequently, the state of the interface can be improved, and thus, the electrical characteristics of a thin film transistor can be enhanced.

As the insulating film such as the gate insulating film of the present invention, only an insulating film formed by high-density plasma treatment may be used, or an insulating film such as silicon oxide, silicon oxynitride, or silicon nitride may be deposited thereon by a CVD method utilizing plasma or thermal reaction to be stacked. In either case, as for a transistor formed by including the insulating film formed using high-density plasma in the part or entire of the gate insulating film, variation in characteristics can be made to be small.

Furthermore, in order to improve the planarization, insulating films 317 and 318 may be provided. In that case, the insulating film 317 may be made of an organic material and the insulating film 318 may be made of an inorganic material. In the case where the insulating films 317 and 318 are provided, the electrode 315 can be formed in these insulating films 317 and 318 so as to be connected to the impurity region through the contact hole.

Further, an insulating film 325 is provided and a lower electrode 327 is formed so as to be connected to the electrode 315. An insulating film 328, which covers an edge portion of the lower electrode 327 and is provided with an opening portion so as to expose the lower electrode 327, is formed. Inside the opening portion, a memory material layer 329 is formed and an upper electrode 330 is formed. In this manner, a memory element 783 having the lower electrode 327, the memory material layer 329, and the upper electrode 330 is formed. The memory material layer 329 can be made of an organic material or an inorganic material. The lower electrode 327 or the upper electrode 330 can be made of a conductive material. For example, a film made of an element of aluminum (Al), titanium (Ti), molybdenum (Mo), tungsten (W), or silicon (Si); an alloy film using these elements; or the like can be used. Furthermore, a light-transmitting material such as indium tin oxide (ITO), indium tin oxide containing silicon oxide, or indium oxide containing 2% to 20 wt % of zinc oxide can be used.

In order to improve planarization further and prevent an impurity element from entering, an insulating film 331 may be formed.

For the insulating film explained in this embodiment mode, an inorganic material or an organic material can be used. As the inorganic material, silicon oxide or silicon nitride can be used. As the organic material, polyimide, acrylic, polyamide, polyimide amide, resist or benzocyclobutene, siloxane, or polysilazane can be used. It is to be noted that a siloxane resin corresponds to a resin including an Si—O—Si bond. Siloxane is composed of a skeleton structure formed by the bond of silicon (Si) and oxygen (O), in which an organic group containing at least hydrogen (for example, an alkyl group or aromatic hydrocarbon) is included as a substituent. Alternatively, a fluoro group may be used as the substituent. Further alternatively, a fluoro group and an organic group containing at least hydrogen may be used as the substituent. Polysilazane is formed by using a polymer material having the bond of silicon (Si) and nitrogen (Ni) as a starting material.

Figure 6B:
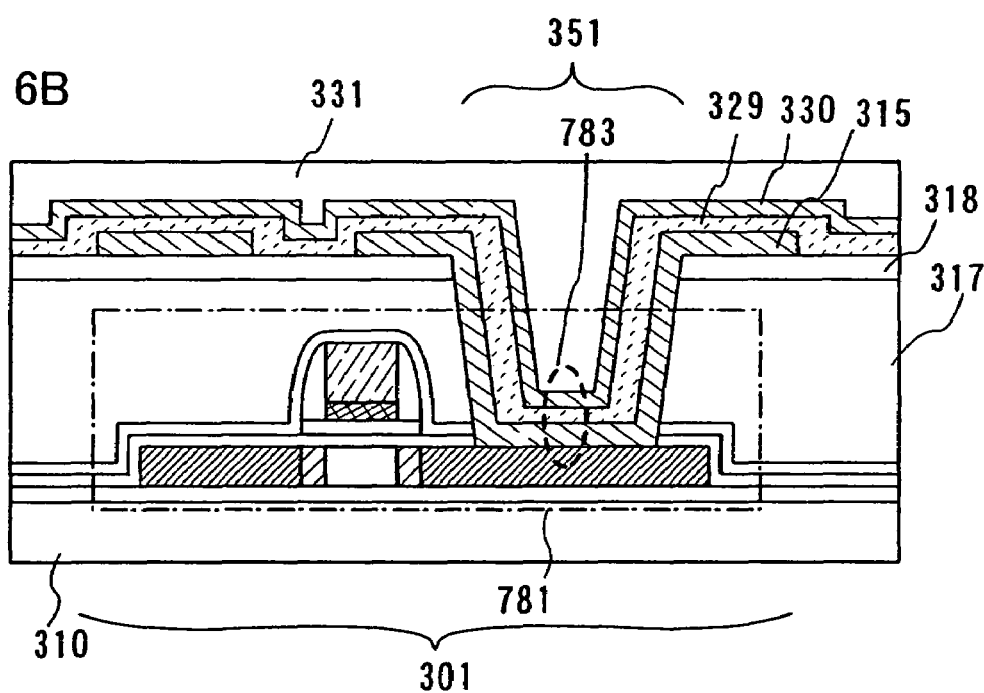

FIG. 6B is a cross-sectional view of a memory element in which the memory material layer is formed in a contact hole 351 of the electrode 315 which is different from FIG. 6A. Similarly to FIG. 6A, the electrode 315 can used as the lower electrode, and the memory material layer 329 and the upper electrode 330 can be formed over the electrode 315 to form the memory element 783. After that, the insulating film 331 is formed. The other structure is the same as FIG. 6A; therefore, description thereof is omitted.

By forming the memory element in the contact hole 351, miniaturization of a memory device can be achieved. Further, since an electrode for a memory is not necessary, the number of manufacturing steps is reduced and a memory device at low cost can be provided.

Embodiment Mode 8

In this embodiment mode, a layout of a thin film transistor which is part of a circuit included in a wireless chip will be explained.

A semiconductor layer corresponding to the semiconductor film 312 shown in the embodiment mode described above is formed over the entire surface or part (a region having a larger area than an area which is fixed as a semiconductor region of a transistor) of a substrate having an insulating surface by interposing a base film or the like between the semiconductor layer and the substrate having an insulating surface. Then, a mask pattern is formed over the semiconductor layer by photolithography. By etching the semiconductor layer utilizing the mask pattern, an island-like semiconductor pattern having a specific shape including a source region, a drain region, and a channel forming region of a thin film transistor can be formed. The shape of the semiconductor layer formed by patterning is determined in consideration of required circuit characteristics or adequacy of a layout based on characteristics of the thin film transistor.

Figure 7:
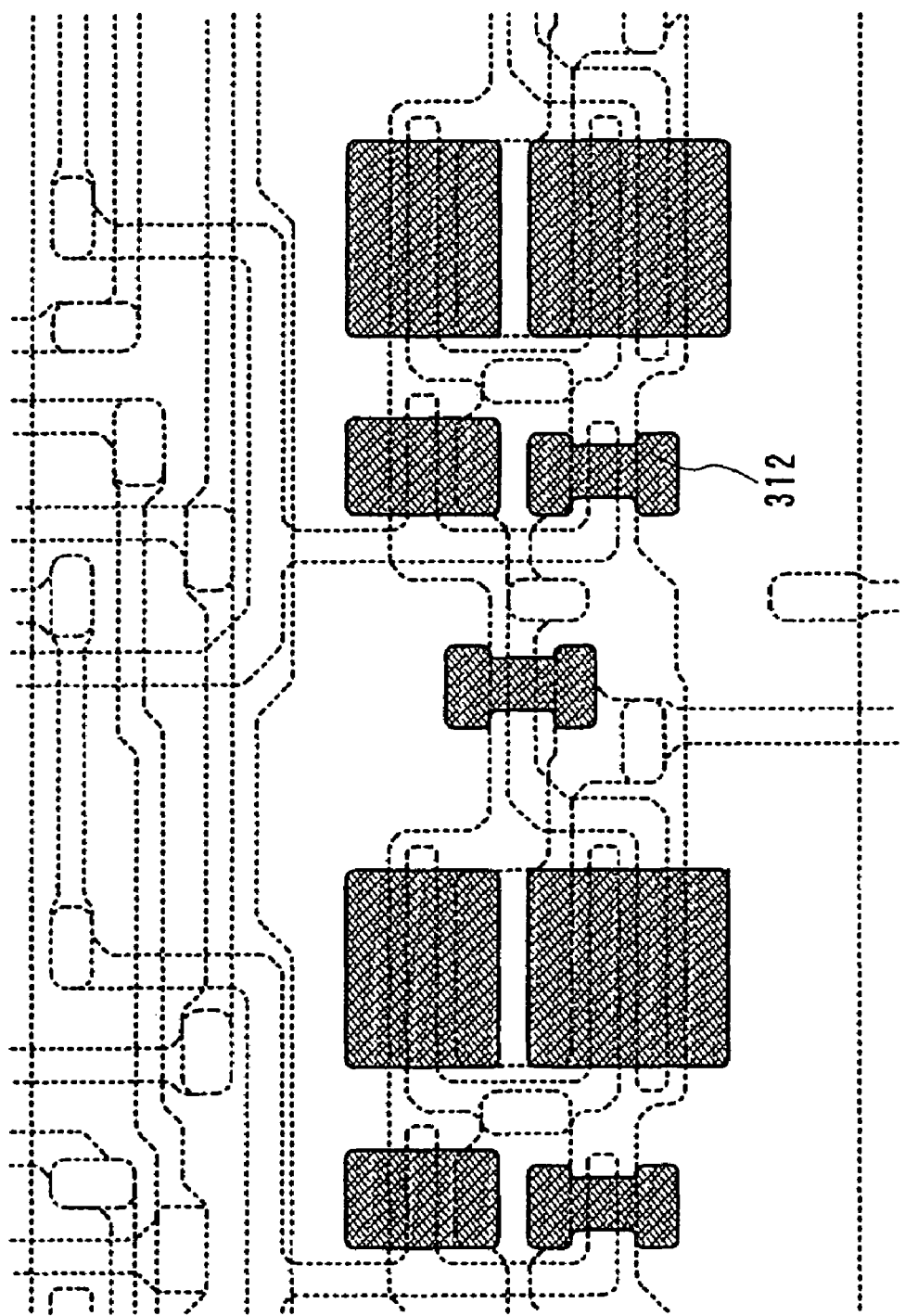
FIG. 7 is a view showing a layout of a thin film transistor of part of a circuit included in a wireless chip of the present invention.

In a thin film transistor of the present invention, a photomask for forming the semiconductor layer is provided with a pattern. This pattern of the photomask has a corner portion, which is rounded by eliminating a right triangle whose side is 10 μm or less at the corner portion. The shape of this mask pattern can be transferred as a pattern shape of the semiconductor film 312 as shown in FIG. 7. When the transfer is conducted to the semiconductor layer, the corner portion of the semiconductor film may be transferred so as to be rounded more than the corner portion of the pattern of the photomask. In other words, a roundness, in which the pattern shape is more smoothed than the pattern of the photomask, may be provided for the corner portion of the pattern of the semiconductor film. It is to be noted that a gate electrode and a wiring to be formed afterward are indicated by a dotted line in FIG. 7.

Next, a gate insulating film is formed over the semiconductor layer which is formed so that the corner portion is rounded. Then, as shown in the embodiment mode described above, a gate electrode 314 and a gate wiring are concurrently formed so as to partly overlap with the semiconductor layer. As the gate electrode or the gate wiring, a metal layer or a semiconductor layer can be deposited and can be formed by photolithography.

Figure 8:
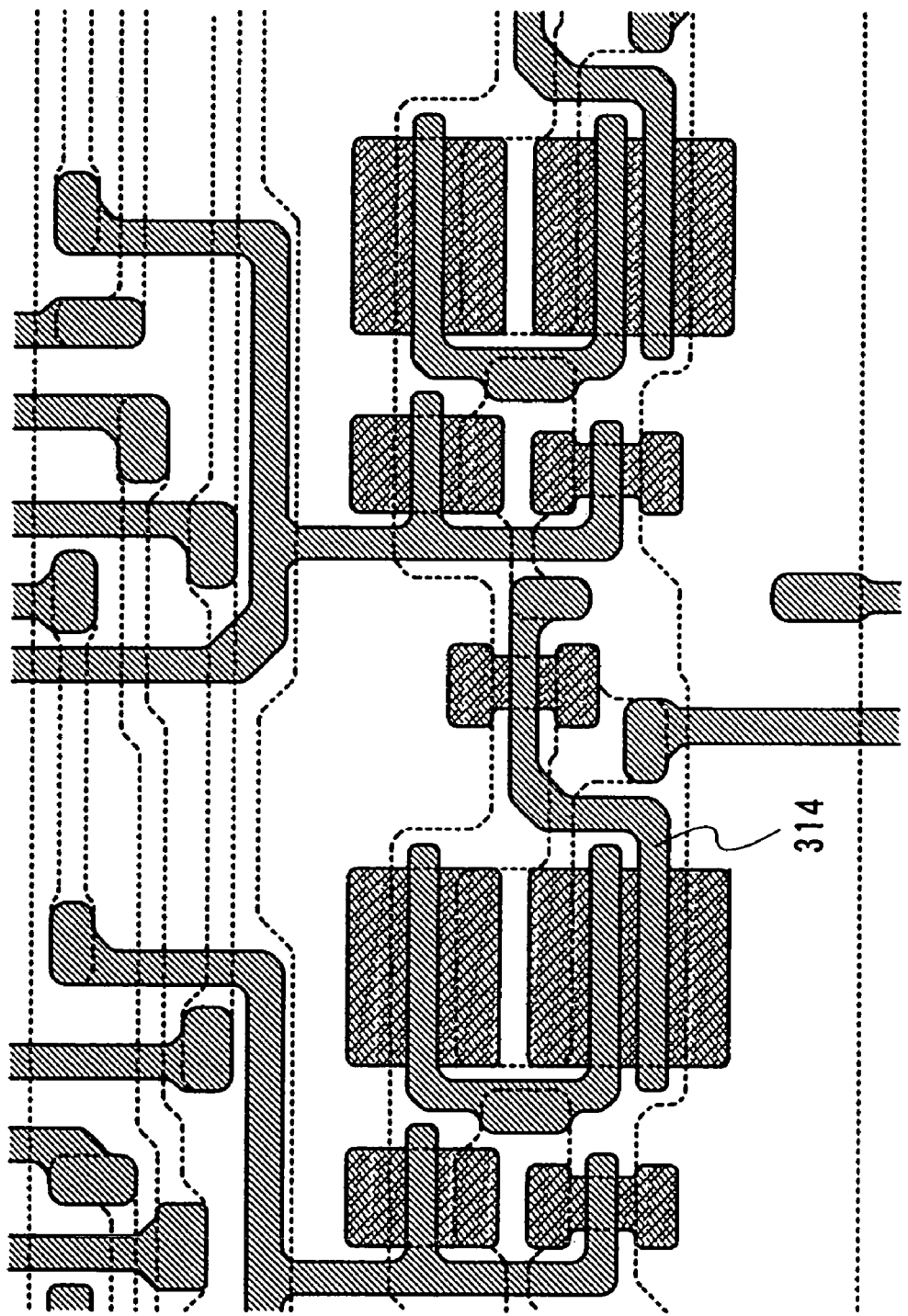
FIG. 8 is a view showing a layout of a thin film transistor of part of a circuit included in a wireless chip of the present invention.

A photomask for forming the gate electrode or the gate wiring is provided with a pattern. In this pattern of the photomask, a right triangle in a corner portion whose edge bent into an L shape is eliminated so that one side of the triangle is 10 μm or shorter, or equal to or longer than one-fifth the width of the wiring layer and equal to or shorter than half the width of the wiring layer. Specifically, part of the photomask corresponding to an isosceles right triangle, which is formed by first two straight lines interposing the corner portion and being perpendicular to each other and a second straight line at approximately 45 degrees to these first two straight lines, is eliminated so that an outer peripheral edge of the corner portion is made to be rounded. The elimination causes two obtuse angle portions to be newly formed. The gate electrode or the gate wiring is preferably etched so that a curved line, which is in contact with both of the first straight line and the second straight line, is formed in each obtuse angle portion by appropriately setting an etching condition. It is to be noted that length of two sides of the isosceles right triangle, which are equal to each other, is made to be ⅕ or more and ½ or less of the width of the wiring. Consequently, outer periphery of the gate electrode or the gate wiring in the corner portion viewed from above is made to form a curved line. An inner periphery of the corner portion is also formed to be rounded along the outer periphery of the corner portion. The shape of this mask pattern can be transferred as a pattern shape of the gate electrode or the gate wiring as shown in FIG. 8. When the transfer to the gate electrode or the gate wiring is conducted, the corner portion of the gate electrode or the gate wiring may be transferred so as to be further rounded. In other words, a roundness, of which the pattern shape is more smoothed than the pattern of the photomask, may be provided in the corner portion of the gate electrode or the gate wiring. The corner portion of the gate electrode or the gate wiring formed using such a photomask can be rounded to be ⅕ or more and ½ or less of the line width of the wiring. It is to be noted that a wiring which is formed afterward is indicated by a dotted line in FIG. 8.

Such a gate electrode or a gate wiring is bent in a rectangular shape due to limitation of a layout. Therefore, a projection portion (an external side) and a depression portion (an internal side) are provided in the rounded corner portion of the gate electrode or the gate wiring. In the rounded projection portion, the generation of fine powder by abnormal electrical discharge in dry etching using plasma can be suppressed. Even if the fine powder is generated in dry etching, the fine powder can be easily washed away in washing in the rounded depression portion. As a result, yield is expected to be drastically improved.

Next, as shown in the embodiment mode described above, an insulating layer or the like corresponding to insulating films 316, 317, and 318 is formed over the gate electrode or the gate wiring. As a matter of course, the insulating film may be a single layer in the present invention.

Subsequently, over the insulating layer, an opening is formed in a predetermined position of the insulating film, and a wiring corresponding to the electrode 315 is formed in the opening. This opening is provided in order that a wiring layer and the semiconductor layer or a gate wiring layer which is in a lower layer are electrically connected to each other. A mask pattern is formed for the wiring by photolithography, and formed to be a predetermined pattern by etching processing.

The wiring can join specific elements together. This wiring does not join a specific element to a specific element with a straight line but bends in a rectangular shape (hereinafter, referred to as a bent portion) due to limitation of a layout. In addition, the wiring may change in its width of the wiring in the opening portion and the other region. For example, in a case where the opening is the same as or larger than the width of the wiring in the opening portion, the width of the wiring is changed to be increased. Further, the wiring also serves as one of electrodes of a capacitor portion due to a layout of a circuit; therefore, the width of the wiring may be increased.

Figure 9:
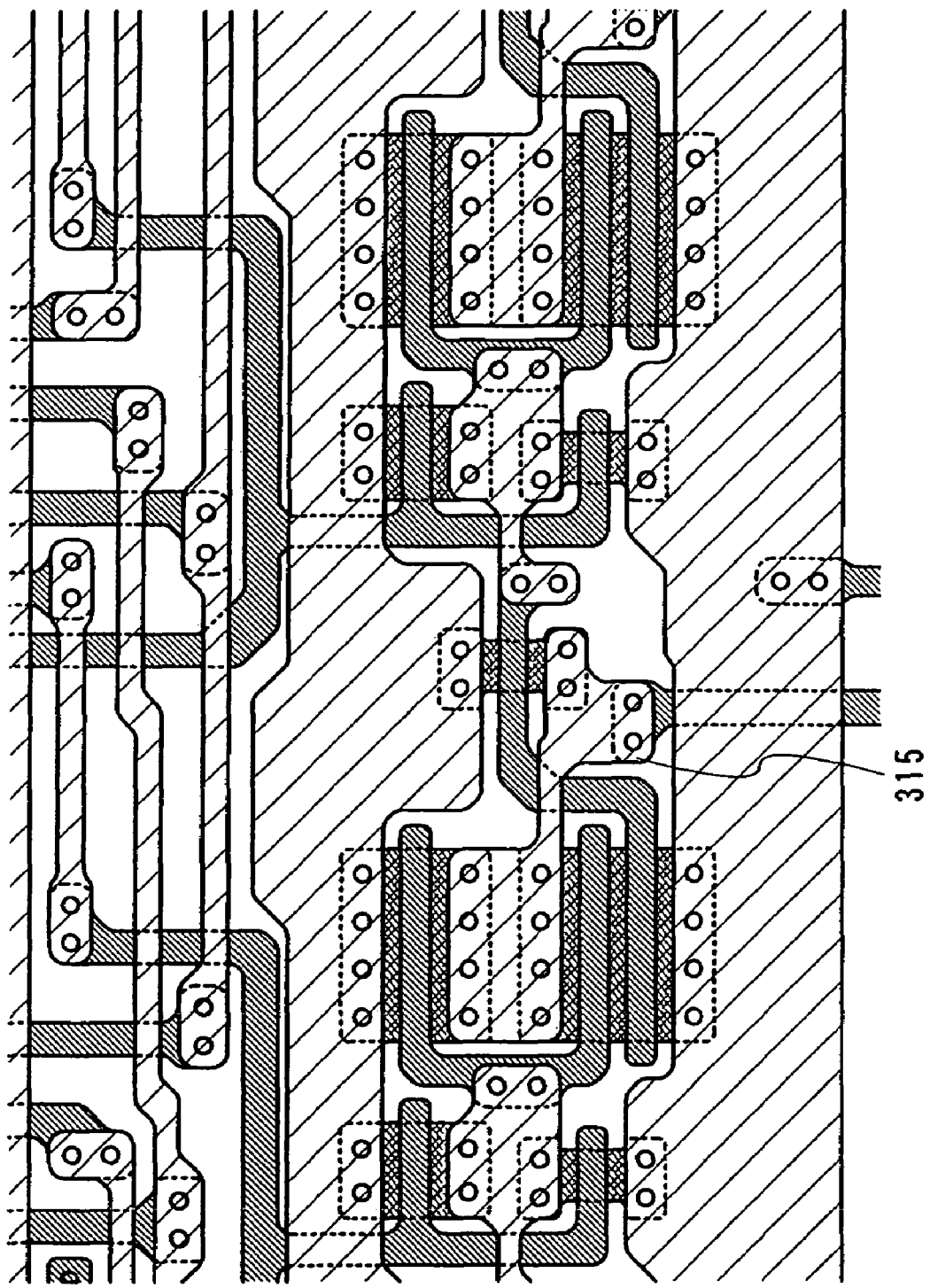
FIG. 9 is a view showing a layout of a thin film transistor of part of a circuit included in a wireless chip of the present invention.

In this case, in the bent portion of the pattern of the photomask, a right triangle in a corner portion whose edge bent into an L shape is eliminated so that one side of the triangle is 10 μm or shorter, or equal to or longer than one-fifth the width of the wiring and equal to or shorter than half the width of the wiring. As shown in FIG. 9, the pattern of the wiring corresponding to the electrode 315 is similarly rounded. The corner portion of the wiring can be rounded in its bent portion so as to be ⅕ or more and ½ or less of the line width of the wiring. By such a rounded wiring, the generation of fine particles by abnormal electrical discharge can be suppressed in dry etching using plasma in a projection portion in the bent portion. Even if fine powder is generated in dry etching, the fine particles can be easily washed away in washing since a depression portion is rounded. As a result, yield is expected to be drastically improved. The corner portion of the wiring is rounded, and accordingly, electric conduction can be expected.

In a circuit having a layout shown in FIG. 9, the bent portion and the corner portion which changes in the width of the wiring are smoothed and rounded, and accordingly, the generation of fine particles by abnormal electrical discharge can be suppressed in dry etching using plasma. Even if the fine particles are generated in dry etching, the fine particles can be easily washed away in washing since the corner portion is rounded. As a result, yield is expected to be drastically improved. In other words, problems on dust or fine particles in a manufacturing process can be solved. Further, the corner portion of the wiring is rounded, and accordingly, electric conduction can be expected. In particular, it is extremely advantageous that dust can be washed away in a wiring in a driver circuit portion or the like provided with multiple parallel wirings.

Although a mode is explained in this embodiment mode, in which the corner portion or the bent portion is rounded in three layouts of the semiconductor layer, the gate wiring, and the wiring, the present invention is not limited to this. In other words, the corner portion or the bent portion may be rounded in any one of layers to solve the problems on dust, fine particles, or the like in a manufacturing process.

Embodiment Mode 9

Figure 10:
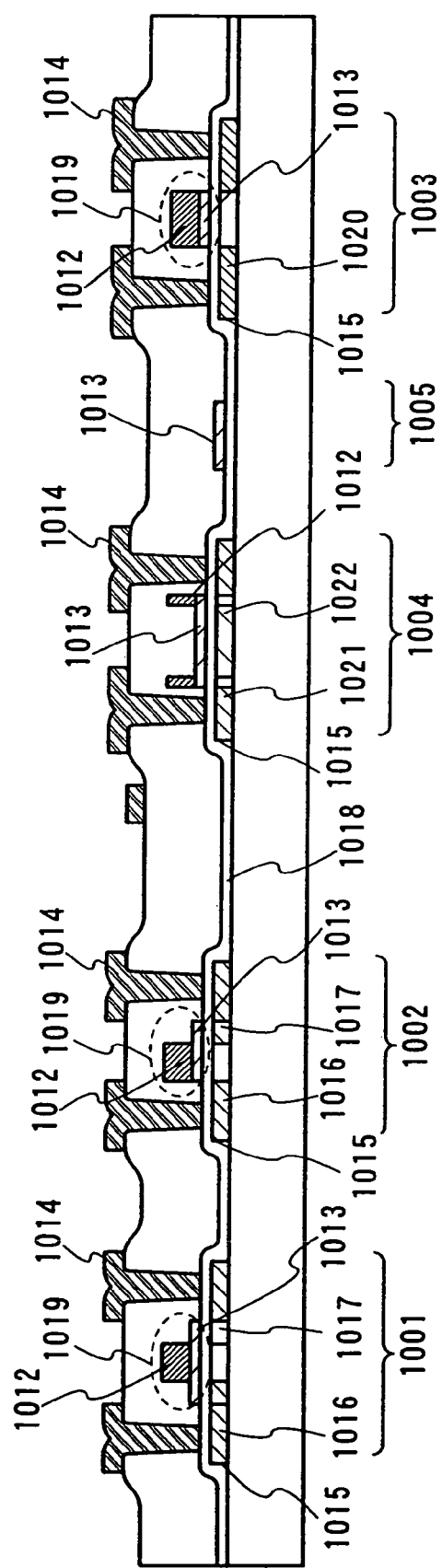
FIG. 10 is a view showing a cross-sectional structure of a transistor.

A circuit of an RFID chip shown in Embodiment Mode 1 is formed by including a transistor. The transistor can be formed by a thin film transistor (TFT) besides a MOS transistor formed on a single crystalline substrate. FIG. 10 is a view showing a cross-sectional structure of a transistor which forms these circuits. FIG. 10 shows an n-channel transistor 1001, an n-channel transistor 1002, a capacitor element 1004, a resistance element 1005, and a p-channel transistor 1003. Each transistor is provided with a semiconductor layer 1015, a gate insulating layer 1018, and a gate electrode 1019. The gate electrode 1019 is formed by a stacked structure of a first conductive layer 1013 and a second conductive layer 1012. FIGS. 11A to 11E are top views corresponding to the transistors, the capacitor element, and the resistance element shown in FIG. 10, which can be referred together with FIG. 10.

In FIG. 10, the n-channel transistor 1001 has an impurity region 1017 in the semiconductor layer. The impurity region 1017 is also referred to as a lightly doped drain (LDD), and is formed in both sides of a channel formation region in a channel length direction (direction in which carriers flow) by doping so as to have lower concentration than impurity concentration of the impurity region 1016 which is connected to a wiring 1014 and forms source and drain regions. When the n-channel transistor 1001 is formed, phosphorus or the like is added as an impurity which imparts n-type to the impurity region 1016 and the impurity region 1017. The LDD is formed as a means for suppressing hot electron deterioration or a short-channel effect.

Figure 11A:
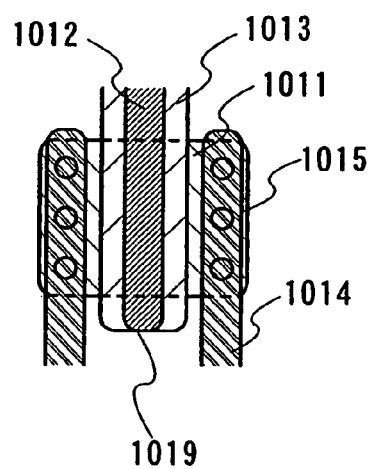
FIGS. 11A to 11E are top views corresponding to a transistor, a capacitor element, and a resistance element.

As shown in FIG. 11A, in the gate electrode 1019 of the n-channel transistor 1001, the first conductive layer 1013 is formed to be spread to both sides of the second conductive layer 1012. In this case, the first conductive layer 1013 is formed to be thinner than the second conductive layer. The first conductive layer 1013 is formed to have a thickness through which ion species accelerated with an electric field of 10 to 100 kV can be made to pass. The impurity region 1017 is formed so as to overlap with the first conductive layer 1013 of the gate electrode 1019. In other words, an LDD region which overlaps with the gate electrode 1019 is formed. In this structure, in the gate electrode 1019, the impurity region 1017 is formed in a self-aligned manner by adding an impurity having one conductivity type through the first conductive layer 1013 using the second conductive layer 1012 as a mask. In other words, the LDD which overlaps with the gate electrode is formed in a self-aligned manner.

A transistor having the LDD in both side of a channel forming region can be applied to a TFT for rectification of the power supply circuit 114 in FIG. 1 or a transistor which forms a transmission gate (also referred to as an analog switch) used for a logic circuit. In these TFTs, both positive and negative voltages are applied to a source electrode or a drain electrode; therefore, the LDD is preferably provided in both side of the channel forming region.

Figure 11B:
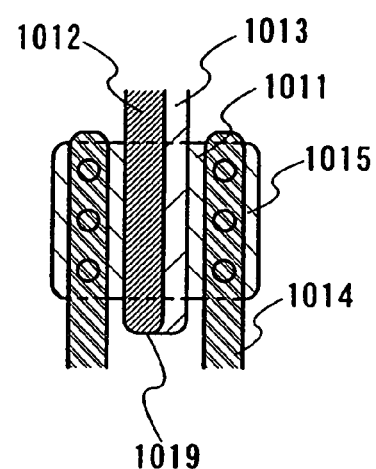

In FIG. 10, in the n-channel transistor 1002, an impurity region 1016 and an impurity region 1017 doped to have lower concentration than impurity concentration of the impurity region 1016, are formed in one side of a channel formation region in the semiconductor layer 1015. As shown in FIG. 11B, in the gate electrode 1019 of the n-channel transistor 1002, the first conductive layer 1013 is formed to be spread to one side of the second conductive layer 1012. Also in this case, the LDD can be formed in a self-aligned manner by adding an impurity having one conductivity type through the first conductive layer 1013 using the second conductive layer 1012 as a mask.

The transistor having the LDD in one side of the channel forming region may be applied to a transistor to which only a positive voltage or a negative voltage is applied between the source and drain electrodes. Specifically, the transistor may be applied to a transistor which forms a logic gate such as an inverter circuit, a NAND circuit, a NOR circuit, or a latch circuit, or a transistor which forms an analog circuit such as a sense amplifier, a constant voltage generation circuit, or a VCO.

Figure 11C:
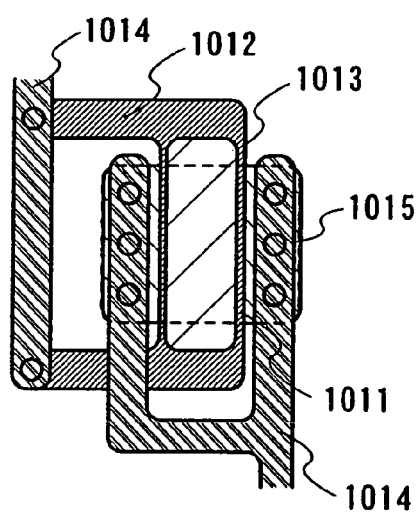
Figure 11D:
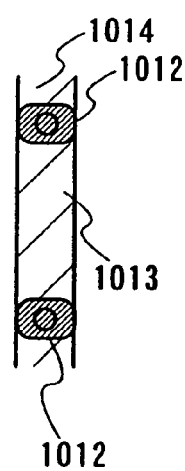
Figure 11E:
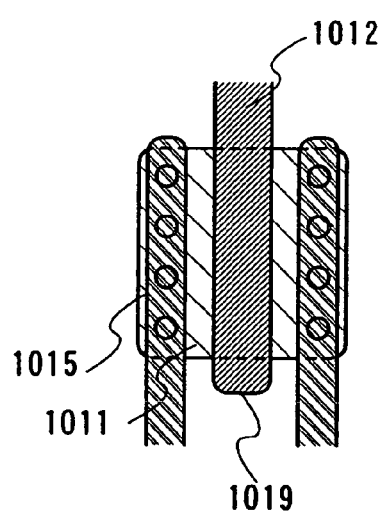

In FIG. 10, the capacitor element 1004 is formed so that the gate insulating layer 1018 is interposed between the first conductive layer 1013 and the semiconductor layer 1015. The semiconductor layer 1015 which forms the capacitor element 1004 is provided with an impurity region 1021 and an impurity region 1022. The impurity region 1022 is formed in a position of overlapping with the first conductive layer 1013 in the semiconductor layer 1015. Further, the impurity region 1021 is connected to the wiring 1014. An impurity having one conductivity type can be added to the impurity region 1022 through the first conductive layer 1013; therefore, impurity concentrations contained in the impurity region 1021 and the impurity region 1022 can be the same or different from each other. In either case, the semiconductor layer 1015 is made to serve as an electrode in the capacitor element 1004; therefore, an impurity having one conductivity type is preferably added to lower resistance. In addition, the first conductive layer 1013 can be made to serve as an electrode sufficiently by utilizing the second conductive layer 1012 as an auxiliary electrode as shown in FIG. 11C. Thus, by employing a composite electrode structure in which the first conductive layer 1013 and the second conductive layer 1012 are combined, the capacitor element 1004 can be formed in a self-aligned manner.

The capacitor element is used as a storage capacitor included in the power supply circuit 114 or a resonant capacitor included in the resonant circuit 113 in FIG. 1. In particular, because both positive and negative voltages are applied between two terminals of the capacitor element, the resonant capacitor is necessary to serve as a capacitor whether a voltage applied between the two terminals is positive or negative.

In FIG. 10, the resistance element 1005 is formed by the first conductive layer 1013. The first conductive layer 1013 is formed to have a thickness of approximately 30 to 150 nm; therefore, the resistance element can be formed by appropriately setting a width or length thereof The resistance element is used as a resistance load included in the modulation circuit 117 in FIG. 1. In addition, there is a case where the resistance element is used as a load in controlling a current by a VCO or the like. The resistance element may be formed by a semiconductor layer including an impurity element at high concentration or a thin metal layer. The metal layer is preferable because a resistance value thereof is determined by a thickness and a film quality, and thus variation is small, while a resistance value of the semiconductor layer depends on a thickness, a film quality, impurity concentration, an activation ratio of an impurity, and the like.

In FIG. 10, the p-channel transistor 1003 is provided with an impurity region 1020 in the semiconductor layer 1015. This impurity region 1020 forms source and drain regions connected to the wiring 1014. The gate electrode 1019 has a structure in which the first conductive layer 1013 and the second conductive layer 1012 overlap. The p-channel transistor 1003 is a transistor having a single drain structure without providing an LDD. In a case of forming the p-channel transistor 1003, boron or the like is added to the impurity region 1020 as an impurity which imparts p-type. On the other hand, if phosphorus is added to the impurity region 1020, an n-channel transistor having a single drain structure can be formed.

One or both of the semiconductor layer 1015 and the gate insulating layer 1018 may be oxidized or nitrided by high-density plasma with electron temperature of 2 eV or less, ion energy of 5 eV or less, and electron density of approximately $10^{11}$ to $10^{13}/cm^3$ excited with a microwave. At this time, by conducting treatment with substrate temperature of 300 to 450° C. and an oxidizing atmosphere ($O_2$, $N_2O$, or the like) or a nitriding atmosphere ($N_2$, $NH_3$, or the like), a defect level of an interface between the semiconductor layer 1015 and the gate insulating layer 1018 can be reduced. By conducting this treatment with respect to the gate insulating layer 1018, this insulating layer can be dense. In other words, the generation of a charged defect can be suppressed and variation in a threshold voltage of a transistor can be suppressed. In a case where a transistor is driven at a voltage of 3 V or less, the insulating layer which is oxidized or nitrided by this plasma treatment can be applied as the gate insulating layer 1018. In a case where a transistor is driven at a voltage of 3 V or more, the gate insulating layer 1018 can be formed by combining the insulating layer which is formed over a surface of the semiconductor layer 1015 by this plasma treatment and the insulating layer which is deposited by a CVD method (a plasma CVD method or a thermal CVD method). In the same manner, this insulating layer can be utilized as a dielectric layer of the capacitor element 1004. In this case, the insulating layer formed by this plasma treatment is formed to have a thickness of 1 to 10 nm and to be dense; therefore, a capacitor element having large charge capacity can be formed.

As explained with reference to FIG. 10 and FIGS. 11A to 11E, elements having various structures can be formed by combining conductive layers each having a different thickness. A region where only the first conductive layer is formed and a region where the first conductive layer and second conductive layer are stacked can be formed using a photomask or the reticle, in which supplementary patterns having a function to reduce the intensity of light and composed of a diffraction grating pattern or a translucent film is set. In other words, in a photolithography step, thicknesses of a resist mask to be developed are differentiated by adjusting the amount of transmitted light of the photomask in a case where a photo resist is exposed to light. In this case, a resist having the complicated shape may be formed by providing a slit having resolution limitation or less to the photomask or the reticle. Further, a mask pattern made of a photo resist material may be deformed by baking at approximately 200° C. after development.

Further, by using the photomask or the reticle, in which a supplementary pattern having a function to reduce the intensity of light and composed of a diffraction grating patterns or a translucent film is set, the region where only the first conductive layer is formed and the region where the first conductive layer and second conductive layer are stacked can be formed in succession. As shown in FIG. 11A, the region where only the first conductive layer is formed can be selectively formed over the semiconductor layer. Such a region is effective on the semiconductor layer; however, the region is not necessary in a region (a wiring region which is connected to the gate electrode) except for the region. By using the photomask or the reticle, the region of only the first conductive layer is not necessary to be formed in a wiring portion; therefore, wiring density can be increased substantially.

In a case of FIG. 10 and FIGS. 11A to 11E, the first conductive layer is made of refractory metal such as tungsten (W), chromium (Cr), tantalum (Ta), tantalum nitride (TaN), or molybdenum (Mo); or alloy or a compound containing refractory metal as its main component, to have a thickness of 30 to 50 nm. The second conductive layer is made of refractory metal such as tungsten (W), chromium (Cr), tantalum (Ta), tantalum nitride (TaN), or molybdenum (Mo); or alloy or a compound containing refractory metal as its main component, to have a thickness of 300 to 600 nm. For example, the first conductive layer and the second conductive layer are made of the different conductive material in order to generate difference in etching rate in an etching step which will be conducted afterward. As one example, TaN can be used for the first conductive layer and a tungsten film can be used for the second conductive layer.

This embodiment shows that transistors each having a different electrode structure, a capacitor element, and a resistance element can be manufactured, respectively, by using the photomask or the reticle, in which a supplementary pattern having a function to reduce the intensity of light and composed of a diffraction grating patterns or a translucent film is set. According to this, elements having a different mode can be formed and integrated without increasing the number of steps.

Embodiment Mode 10

In this embodiment mode, a usage mode of an operation-stop system of the present invention will be explained using an example.

A semiconductor device of the present invention has features of a small size, a thin shape, and lightweight. According to the above-described features, the semiconductor device of the present invention can be utilized as a wireless chip. Further, the semiconductor device of the present invention can be used as a wireless chip safely because an operation-stop system is provided.

For example, the semiconductor device of the present invention can be provided for packing containers, documents, recording medium, personal belongings, foods, garments, health articles, livingware, medicines, electronic devices, and the like. These examples will be explained with reference to FIGS. 12A to 12D. It is to be noted that, in FIGS. 12A to 12D, a wireless chip 1201 is provided for each.

Figure 12A:
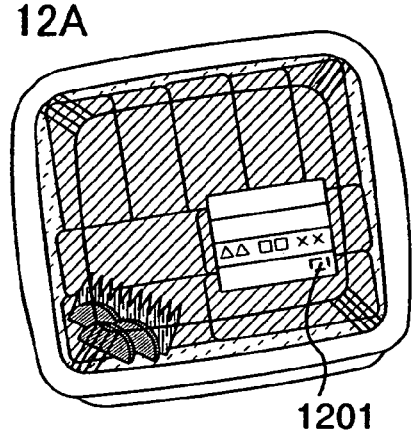
FIGS. 12A to 12D are explanatory views of a usage mode of a semiconductor device of the present invention.
Figure 12B:
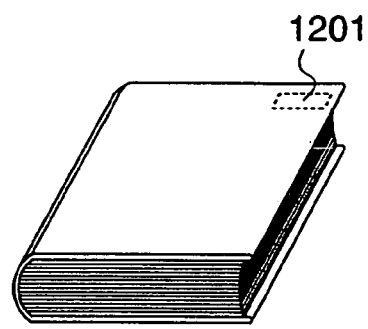
Figure 12C:
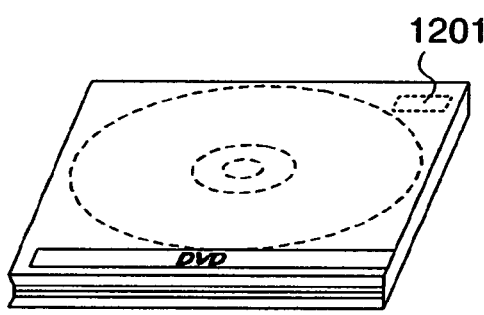
Figure 12D:
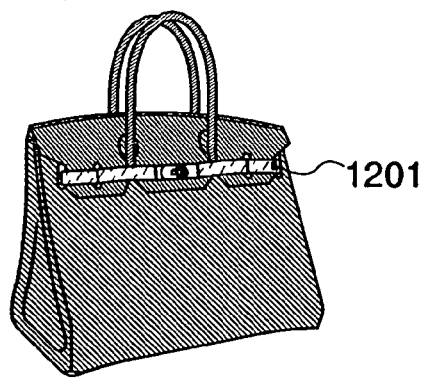

The packing containers refer to wrapping paper for lunch or the like, plastic bottles, and the like (refer to FIG. 12A). The documents refer to volumes, books, and the like (refer to FIG. 12B). The recording medium refers to DVD software, video tapes, and the like (refer to FIG. 12C). The personal belongings refer to bags, glasses, and the like (refer to FIG. 12D). The foods refer to food articles, drinks, and the like. The garments refer to clothes, chaussures, and the like. The health articles refer to medical appliances, health appliances, and the like. The livingware refers to furniture, lighting equipment, and the like. The medicines refer to medical products, pesticides, and the like. The electronic devices refer to liquid crystal display devices, EL display devices, television devices (TV receivers or flat-screen television receivers), cellular phones, and the like.

Efficiency of an inspection system and the like can be improved and counterfeits or thefts can be prevented by providing a wireless chip for the packing containers, documents, recording medium, or the like, personal belongings, foods, livingware, health articles, medicines, electronic devices, and the like. As for medicines, medicine can be prevented from being taken mistakenly. The wireless chip is provided for goods by being attached to their surfaces or embedded therein. For example, the wireless chip may be embedded in a paper in a case of a book or embedded in an organic resin in a case of a package made of the organic resin. In the case of writing by an optical effect afterward, a transparent material is preferably used so that light can be emitted to a portion of a memory element provided for a chip. Further, problems on privacy and the like after a user purchases a product can also be solved by providing a system by which a wireless chip is put into a stop state.

As a method of by which a wireless chip is put into a stop state, for example, an operation-stop instruction is written into a wireless chip in holding a barcode reader to a barcode portion of a product at a register when a product is purchased. In other words, a memory material layer of which physical characteristics of a wireless chip is not changed reversibly is physically changed to store the operation-stop instruction as data. At this time, a wireless chip may be provided in the vicinity of a portion where a barcode is attached to a product, or a wireless chip may have a barcode function. Thus, if an operation-stop instruction is written into a wireless chip, the wireless chip can not be operated again; therefore, privacy after purchasing a product can be protected.

It is to be noted that the usage mode shown in this embodiment mode is merely for illustration and not limited to this. In addition, this embodiment mode can be implemented by being freely combined with the embodiment mode described above.

This application is based on Japanese Patent Application serial No. 2005-159479 field in Japan Patent Office on May 31, 2005, the entire contents of which are hereby incorporated by reference.

The invention claimed is:

1. A semiconductor device comprising:
   an antenna;
   a memory cell over an insulating substrate comprising:
      a thin film transistor comprising a polycrystalline silicon over the insulating substrate;
      an insulating film over the thin film transistor, the insulating film having at least one opening;
      a first electrode over the insulating film and electrically connected to an impurity region of the thin film transistor through the opening of the insulating film;
      a memory material layer comprising an organic material over the first electrode; and
      a second electrode over the memory material layer, and
   a control circuit,
   wherein the control circuit is arranged to process an instruction and to store data in the memory cell by irreversibly changing physical characteristics of the memory cell, and
   wherein the instruction stops operation of the semiconductor device.

2. A semiconductor device according to claim 1, wherein the physical characteristics of the memory cell are changed by an electric effect, an optical effect, or a thermal effect to the memory material layer.

3. A semiconductor device according to claim 1, wherein the physical characteristics are resistance characteristics.

4. A semiconductor device according to claim 1, wherein a light emitting material is used for the memory material layer.

5. A semiconductor device according to claim 4, wherein metal oxide is included in the memory material layer.

6. A semiconductor device according to claim 1, wherein metal oxide is included in the memory material layer.

7. A semiconductor device according to claim 1,
   wherein the control circuit comprises a transistor having a gate electrode, and
   wherein a corner portion of the gate electrode is rounded.

8. A semiconductor device according to claim 1, wherein one of the electrodes is on and in contact with the thin film transistor.

9. A semiconductor device comprising:
   an antenna;
   a memory circuit including a memory cell array, the memory cell array comprising:
      a plurality of bit lines extending in a first direction;
      a plurality of word lines extending in a perpendicular direction to the first direction;
      a plurality of memory cells which are formed over an insulating substrate, each of the plurality of memory cells comprising:
         a thin film transistor comprising a polycrystalline silicon over the insulating substrate;
         an insulating film over the thin film transistor, the insulating film having at least one opening;
         a first electrode over the insulating film and electrically connected to an impurity region of the thin film transistor through the opening of the insulating film;
         a memory material layer comprising an organic material over the first electrode; and
         a second electrode over the memory material layer, and
      a control circuit,
   wherein a memory cell is formed at each intersection of the bit line and the word line, the memory material layer is provided between the bit line and the word line of the memory cell,
   wherein the control circuit is arranged to process an instruction and to store data in the memory cell by irreversibly changing physical characteristics of the memory cell, and
   wherein the instruction stops operation of the semiconductor device.

10. A semiconductor device according to claim 9, wherein the physical characteristics of the memory cell are changed by an electric effect, an optical effect, or a thermal effect to the memory material layer.

11. A semiconductor device according to claim 9, wherein the physical characteristics are resistance characteristics.

12. A semiconductor device according to claim 9, wherein a light emitting material is used for the memory material layer.

13. A semiconductor device according to claim 12, wherein metal oxide is included in the memory material layer.

14. A semiconductor device according to claim 9, wherein metal oxide is included in the memory material layer.

15. A semiconductor device according to claim 9,
   wherein the control circuit comprises a transistor having a gate electrode, and
   wherein a corner portion of the gate electrode is rounded.

16. A semiconductor device comprising:
   a circuit having an antenna;
   a memory circuit having a ROM and a RAM, wherein the ROM has a memory cell over an insulating substrate, the memory cell comprising:

a thin film transistor comprising a polycrystalline silicon over the insulating substrate, an insulating film over the thin film transistor, the insulating film having at least one opening;

a first electrode over the insulating film and electrically connected to an impurity region of the thin film transistor through the opening of the insulating film;

a memory material layer comprising an organic material over the first electrode; and a second electrode over the memory material layer, and a receiving circuit which stores an instruction received from the antenna as data in the RAM;

a transmitting circuit which transmits the data taken from the RAM to the circuit having the antenna; and a control circuit, wherein the control circuit is arranged to read data from the RAM in which an operation-stop instruction received from the antenna is stored as the data wherein the control circuit is arranged to store the data read from the RAM in the memory cell by irreversibly changing physical characteristics of the memory cell, and wherein operation of the control circuit is stopped by the operation-stop instruction.

17. A semiconductor device according to claim 16, wherein the physical characteristics of the memory cell are changed by an electric effect, an optical effect, or a thermal effect to the memory material layer.

18. A semiconductor device according to claim 16, wherein the physical characteristics are resistance characteristics.

19. A semiconductor device according to claim 16, wherein a light emitting material is used for the memory material layer.

20. A semiconductor device according to claim 19, wherein metal oxide is included in the memory material layer.

21. A semiconductor device according to claim 16, wherein metal oxide is included in the memory material layer.

22. A semiconductor device according to claim 16, wherein the control circuit comprises a transistor having a gate electrode, and wherein a corner portion of the gate electrode is rounded.

23. A semiconductor device comprising:

a circuit having an antenna;

a memory circuit having a ROM and a RAM, wherein the ROM has a memory cell array, the memory cell array comprising:

a plurality of bit lines extending in a first direction;

a plurality of word lines extending in a perpendicular direction to the first direction;

a plurality of memory cells, each of the plurality of memory cells over an insulating substrate comprising:

a thin film transistor comprising a polycrystalline silicon over the insulating substrate;

an insulating film over the thin film transistor, the insulating film having at least one opening;

a first electrode over the insulating film and electrically connected to an impurity region of the thin film transistor through the opening of the insulating film;

a memory material layer comprising an organic material over the first electrode; and a second electrode over the memory material layer, and a receiving circuit which stores an instruction received from the antenna as data in the RAM;

a transmitting circuit which transmits the data taken from the RAM to the circuit having the antenna; and a control circuit, wherein each of the memory cells is formed at each intersection of the bit line and the word line, the memory material layer is provided between the bit line and the word line of the memory cell array, wherein the control circuit is arranged to read data from the RAM in which an operation-stop instruction received from the antenna is stored as the data and data in the memory cells by changing physical characteristics of the memory cells, and wherein the control circuit is arranged to store the data from the RAM in the memory cells by irreversibly changing physical characteristics of the memory cells, and wherein operation of the control circuit is stopped by the operation-stop instruction.

24. A semiconductor device according to claim 23, wherein the physical characteristics of the memory cells are changed by an electric effect, an optical effect, or a thermal effect to the memory material layer.

25. A semiconductor device according to claim 23, wherein the physical characteristics are resistance characteristics.

26. A semiconductor device according to claim 23, wherein a light emitting material is used for the memory material layer.

27. A semiconductor device according to claim 26, wherein metal oxide is included in the memory material layer.

28. A semiconductor device according to claim 23, wherein metal oxide is included in the memory material layer.

29. A semiconductor device according to claim 23, wherein the control circuit comprises a transistor having a gate electrode, and wherein a corner portion of the gate electrode is rounded.

* * * * *